United States Patent [19]

Kobayashi

[11] Patent Number: 5,314,564
[45] Date of Patent: May 24, 1994

[54] APPARATUS FOR ATTACHING BAR CODES TO RETICLE CASES

[75] Inventor: Kenji Kobayashi, Tokyo, Japan
[73] Assignee: Lintec Corporation, Tokyo, Japan
[21] Appl. No.: 753,156
[22] Filed: Aug. 30, 1991

[30] Foreign Application Priority Data

Sep. 26, 1990 [JP] Japan .................. 2-254169

[51] Int. Cl.$^5$ .................. B32B 31/00
[52] U.S. Cl. .................. 156/384; 156/387; 156/379; 156/538; 156/350; 355/75; 235/462; 414/220; 414/225; 414/226
[58] Field of Search .......... 156/350, 384, 387, 379, 156/538; 355/75, 282, 112; 235/462, 132 R; 414/220, 223, 225, 226; 363/108

[56] References Cited

U.S. PATENT DOCUMENTS

| | | | |
|---|---|---|---|
| 3,072,253 | 1/1963 | Ridenour | 156/350 |
| 4,263,766 | 4/1981 | Baker et al. | 53/50 |
| 4,638,144 | 1/1987 | Latta, Jr. | 219/121 LH |
| 4,726,865 | 2/1988 | Treat | 156/249 |
| 4,759,810 | 7/1988 | Jackson et al. | 156/350 |
| 4,821,078 | 4/1989 | Nishida et al. | 355/75 |
| 4,891,088 | 1/1990 | Svyatsky | 156/350 |
| 4,896,189 | 1/1990 | Akuzawa | 355/75 |
| 4,999,671 | 3/1991 | Iizuka | 355/75 |
| 5,005,052 | 4/1991 | Watanabe et al. | 355/75 |
| 5,016,049 | 5/1991 | Onishi et al. | 355/75 |
| 5,017,257 | 5/1991 | Murphy | 156/270 |
| 5,036,355 | 7/1991 | Wally, Jr. et al. | 355/75 |
| 5,118,929 | 6/1992 | Scata | 235/462 |
| 5,119,213 | 6/1992 | Graves et al. | 355/75 |

FOREIGN PATENT DOCUMENTS 2567708  1/1986  France.

OTHER PUBLICATIONS

"Chip Identification Writing System", IBM Technical Disclosure Bulletin, vol. 27, No. 10A, Mar. 1985, pp. 5883–5890.

Primary Examiner—Patrick J. Ryan
Assistant Examiner—Merrick Dixon
Attorney, Agent, or Firm—Armstrong, Westerman, Hattori, McLeland & Naughton

[57] ABSTRACT

An apparatus for attaching a bar code to a reticle case has an elevating base which is movable up and down and is rotatable with the reticle case placed thereon. The reticle case contains therein a reticle so as to be taken in and taken out through an outlet on a side thereof. An opening device for opening the outlet of the reticle case is positioned in a predetermined position. Take-in/takeout device lifts the reticle while the outlet is open and then transfer the reticle between an inside of the reticle case and a transfer device outside the reticle case. A carrying base receives the reticle held by the transfer device and then moves it to and from a position in front of a reading device for reading a mark which is marked on the reticle. A label attaching device prints, on a label, a bar code according to a signal from the reading device and then attaches the label, on which the bar code has been printed, to the reticle case.

10 Claims, 24 Drawing Sheets

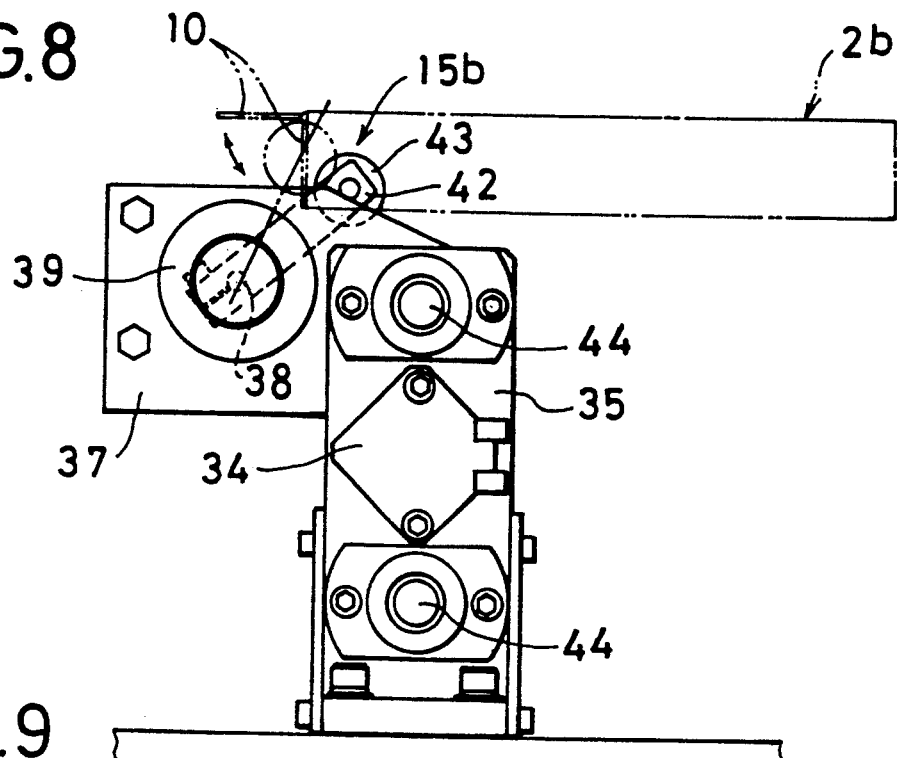
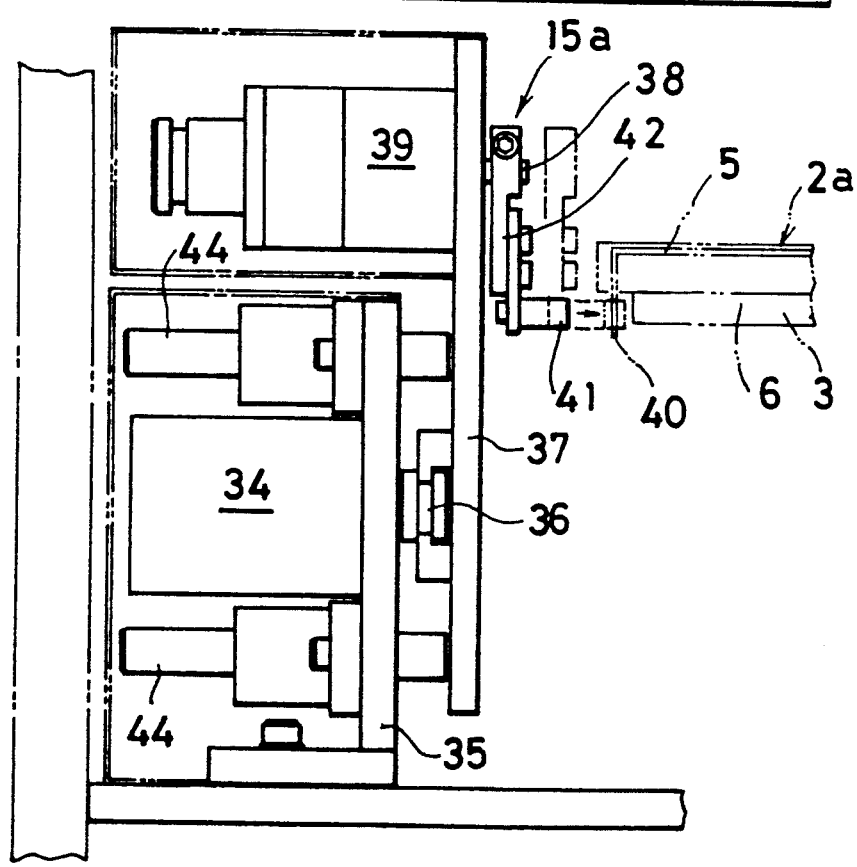

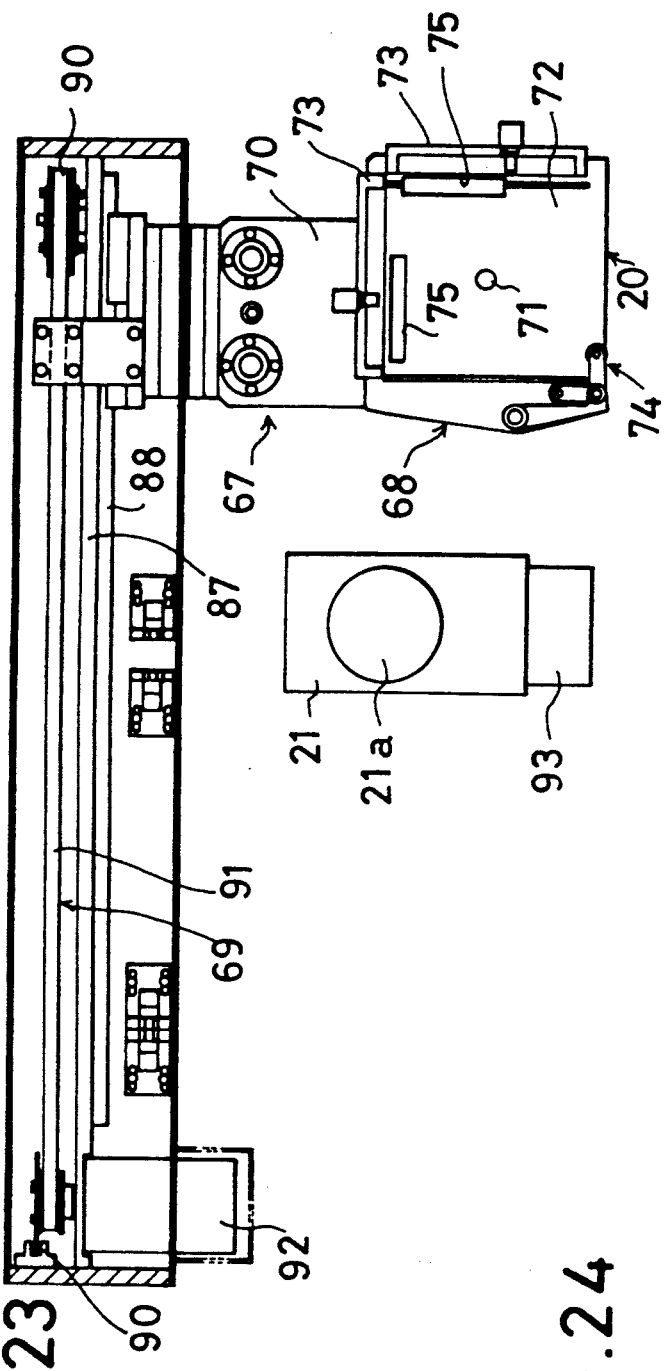
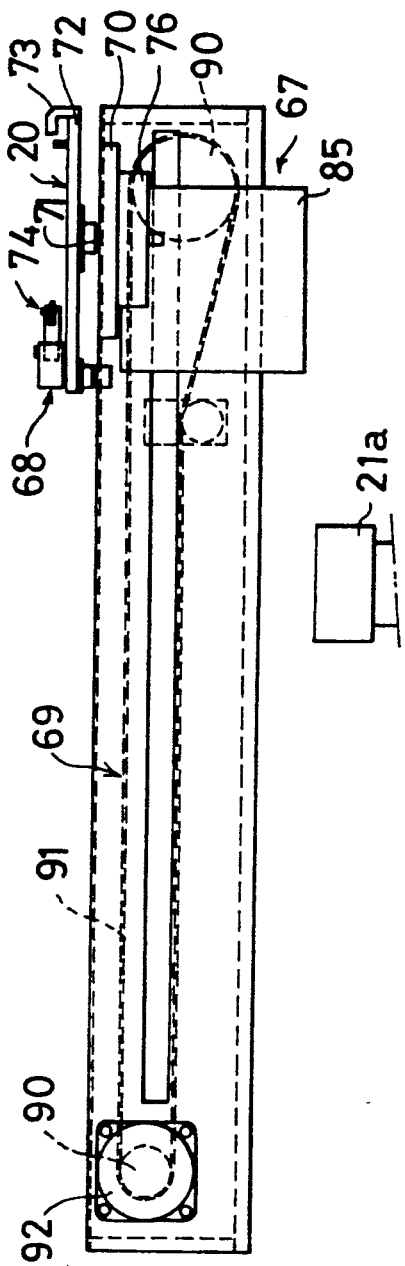
FIG.23
FIG.24

FIG. 25
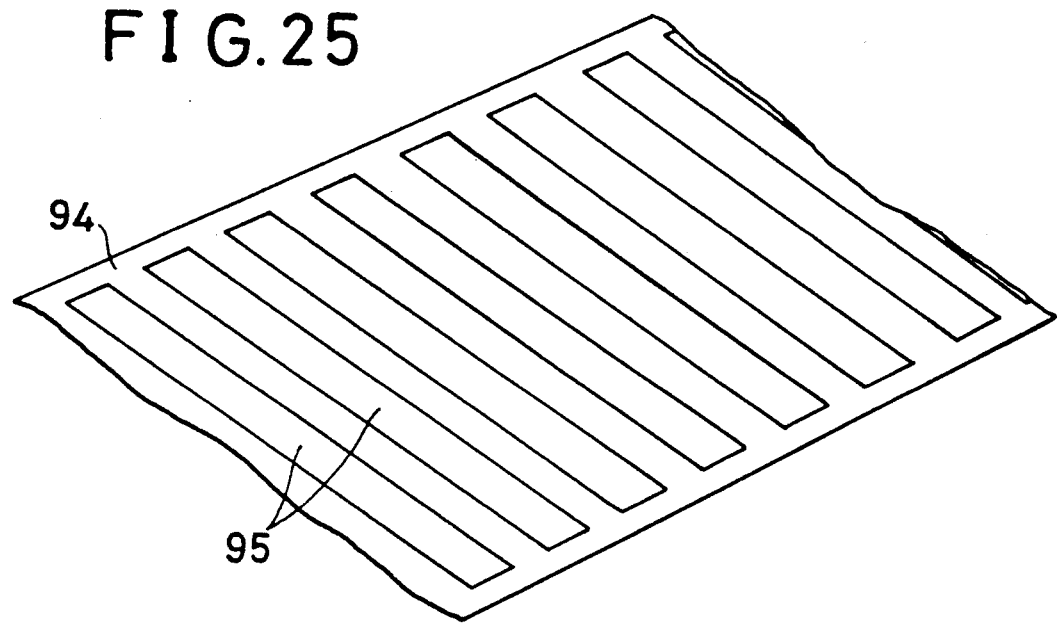
FIG. 26
FIG. 27
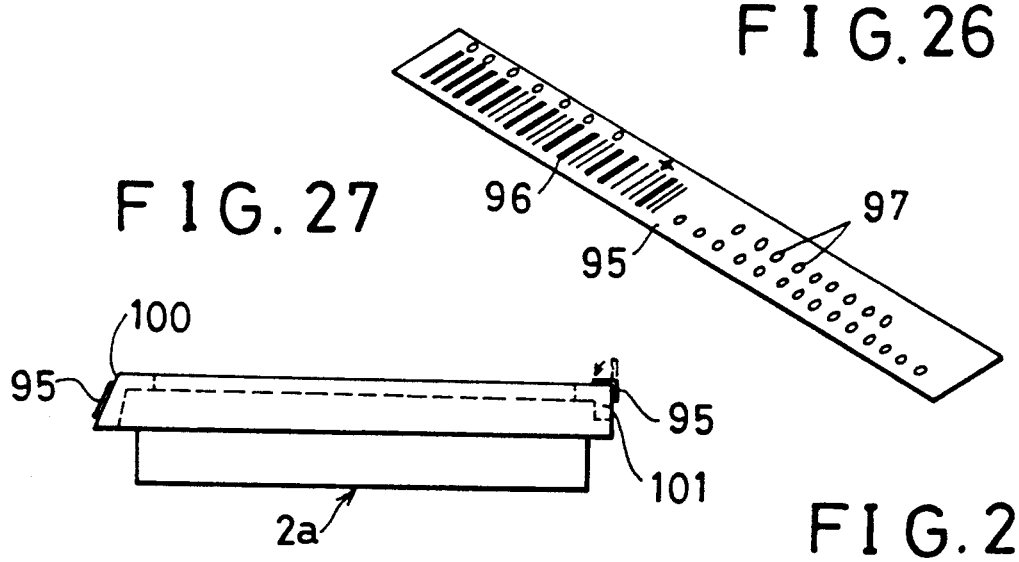
FIG. 28
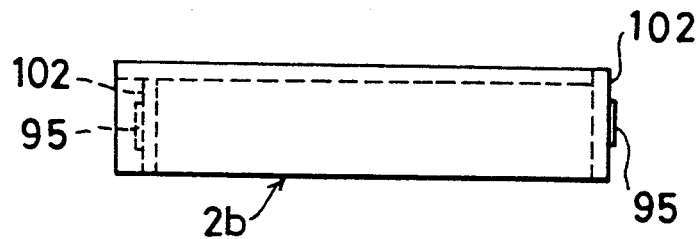

APPARATUS FOR ATTACHING BAR CODES TO RETICLE CASES

BACKGROUND OF THE INVENTION

This invention relates to an apparatus for attaching bar codes to reticle cases which contain therein reticles (original integrated circuit patterns) in order to control or inventory the reticles to be used in the process of manufacturing semiconductors.

Conventional reticles have printed or marked code numbers of integrated circuits to be manufactured, on their corners in an individual character size of 0.5-2 mm. After having done with them, the reticles are stored for control by means of the code numbers. Each reticle is stored in a flat and square reticle case 2, as shown in FIG. 1, of synthetic resin make having a transparent upper surface 1. The body part 3 of the reticle case 2 is covered with a lid 4 of sliding type whose upper surface 1 is transparent. Normally, the body part 3 and the lid 4 are engaged with each other via a lock mechanism (not shown) by a long lock 5 on a side thereof. The body part 3 is taken out, by sliding, through an outlet 6 of the lid 4 by rotating the lock 5 to release the lock mechanism, and a reticle 7 inside the body part 3 is taken out. The patterned surface of the reticle 7 is covered with a protection cover (pelicle) 8. A 10-digit code number 9 is marked on the reticle 7 outside the protection cover 8 in alignment with the takeout direction in a character height of 1 mm.

Another type of reticle case is shown in FIG. 2. In this type, a side plate 10, which can be swung upwards to open, is provided in a body part 3 of square case shape whose upper surface 1 is transparent. The reticle 7 is taken in (or inserted into), or taken out through, the outlet 6 by opening the side plate 10. A protection cover 8 is also attached to the reticle 7. A code number 9 comprising small 10-digit code numerals is printed on the reticle 7 outside the protection cover 8 in a direction at right angles to the takeout direction.

In case where a large number of reticles are stored, it is not easy to find out a reticle case containing therein a required reticle. It is not easy to recognize the code number with naked eyes through the transparent upper surface because the code number is small.

If the same code number as that on the reticle to be stored therein is marked large also on the reticle case, it will be easy to find it out. However, when the code number comprises characters or numerals extending as long as 30 digits, manually marking them on the reticle case will take much time and is not preferable in that a risk of making a mistake in marking is accompanied. It is also considered to print the characters or numerals on a label with a printing machine and then attach the label to the reticle case. It is also not preferable to do so because there is a risk of wrongly reading the code number on the reticle case because it is small, and because there is a risk of wrongly operating the printing machine.

Upon careful study, the inventors have come to a conclusion that this kind of risks can be solved by optically reading the characters or marks on the reticle, printing a mark comprising a bar code on a label based on data obtained by the optical reading, and then attaching the label to the reticle case. If a bar code is attached, a reticle case containing a desired reticle can be easily found out by reading the bar code with a bar code reader.

SUMMARY OF THE INVENTION

An object of this invention is to provide an apparatus for accurately describing, on a reticle case, a mark which corresponds to a letter or another mark marked on a reticle.

Another object of this invention is to provide an apparatus for reading characters or a first mark marked on the reticle and then automatically attaching, to the reticle case, a label having printed thereon a second mark comprising a bar code which corresponds to the characters or the first mark.

Still another object of this invention is to provide an apparatus for reading characters or the like marked on the reticle even if they are marked in different positions, and for attaching, to a plurality of positions, labels having printed thereon bar codes which correspond to the characters or the like.

Still further object of this invention is to provide an apparatus for attaching a label also on a surface which is not plane.

In order to attain the above-described objects, according to one aspect of this invention, there is provided an apparatus for attaching a bar code to a reticle case which comprises: an elevating base which is movable up and down with the reticle case placed thereon, the reticle case containing therein a reticle so as to be taken in and taken out through an outlet on a side thereof; opening means for opening the outlet of the reticle case which is positioned in a predetermined position; take-in/takeout means for lifting the reticle while the outlet is open and then transferring it between an inside of the reticle case and transfer means outside the reticle case; a carrying base for receiving the reticle held by the transfer means and then moving it to and from a position in front of reading means for reading a mark which is marked on the reticle; and label attaching means for printing, on a label, a bar code according to a signal from the reading means and then attaching to the reticle case the label on which the bar code has been printed.

In one preferred mode, when the elevating base on which the reticle case is placed stops at a predetermined position, the opening means opens the outlet of the reticle case. Then, the take-in/takeout means enters the reticle case through the opened outlet on a side thereof to lift the reticle directly or indirectly. The lifted reticle is conveyed to the transfer means which is located outside the reticle case. The outlet of the reticle case is closed after the reticle has been taken out.

The transfer means picks up the reticle that has been lifted by the take-in/takeout means and then moves to place it on the carrying base. The carrying base carries the reticle to the front of the reading means and then let the reading means read out the code number marked on the reticle. The position in which the code number is marked varies with the kind of reticles. Therefore, the carrying base rotates such that the code number is positioned in front of the reading means. When the reading by the reading means has been finished, the carrying base returns to its original position. In this position, transfer means picks up the reticle on the carrying base to hand it over to the take-in/takeout means. The take-in/takeout means waits at that position while holding up the reticle.

The reading means transmits the signal of the code number to a printer of the label attaching means and prints, on a label prepared in the label attaching means, a mark which comprises a bar code corresponding to the code number. The label attaching means is disposed in a position which faces the elevating base and is lower than the reticle takeout position. When the reticle has been taken out from the reticle case, the elevating base is lowered and keeps waiting in a condition in which that side surface of the reticle case to which the label is attached is positioned in front of the label attaching means. The label with the bar code printed thereon is then attached by the label attaching means to a predetermined side surface of the empty reticle case on the elevating base. When a label is required to be attached also to another side surface of the reticle case, the elevating base is rotated such that said another side surface of the reticle case faces the label attaching means. A label on which the same code number has been printed by the printer is attached to said another side surface by the attaching means.

When the label attaching has been finished, the elevating base is lifted to the original position, i.e., the position in which the reticle was taken out. The outlet of the reticle case is opened once again by the opening means, and the reticle which is being held by the take-in/takeout means is taken in or contained inside the reticle case.

If the above-described operations are repeated in sequence by, for example, lowering the elevating base while placing thereon a plurality of reticle cases containing therein reticles, it is possible to mark on the reticle cases the marks that are the same as the code numbers described o the reticles. Even if the code numbers consist of 30 digits, for example, the marking can be made without any mistake.

Some side surfaces of the reticle cases, to which the labels are attached, are inclined or located in corner portions. In case labels are attached to the inclined surfaces, the label attaching means itself is inclined to adapt itself to the inclined surfaces before the labels are attached. In case labels are attached to corner portions, the labels are first attached thereto while allowing them to partially project from the corner edges. Thereafter, entire labels are attached to the corner portions by urging the projected portions by case holding means.

BRIEF DESCRIPTION OF THE DRAWINGS

The above and other objects and the attendant advantages of this invention will become readily apparent by reference to the following detailed description when considered in conjunction with the accompanying drawings wherein:

FIG. 8 is a side view of FIG. 7;

FIG. 9 is a front view of the other of the opening devices;

FIGS. 11 through 14 are detailed views of takein/-takeout means in which;

FIG. 11 is a perspective view of an important part of the take-in/takeout means, FIG. 12 is a sectional side view taken along the line XII—XII of FIG. 11, FIG. 13 is a sectional side view taken along the line XIII—XIII of FIG. 11 and FIG. 14 is a sectional side view taken along the line XIV—XIV of FIG. 11, FIGS. 15 through 19 are detailed views of a transfer device in which;

FIGS. 20 through 24 are detailed views of a carrying base in which;

FIG. 20 is a plan view of an important portion of the carrying base,

FIG. 21 is a sectional side view taken along the line XXI—XXI of FIG. 20,

FIG. 22 is a sectional view taken along the line XXII—XXII of FIG. 20,

FIG. 23 is a sectional plan view taken along the line XXIII—XXIII of FIG. 21,

FIG. 24 is a side view of FIG. 21,

FIGS. 25 and 26 are perspective views of a label;

FIGS. 27 and 28 are side views in which the label is attached to the reticle case;

FIGS. 29 through 31 are detailed views of a label attaching head of a label attaching device in which;

FIG. 29 is a side view of the label attaching head,

FIG. 30 is a plan view of FIG. 29,

FIG. 31 is a left side view of FIG. 29,

FIGS. 32 through 35 are detailed views of case holding devices in which;

FIG. 32 is a side view of one of the case holding devices,

FIG. 33 is a plan view taken along the line XXXIII—XXXIII of FIG. 32,

FIG. 34 is a side view of the other of the case holding devices,

FIG. 35 is a plan view of FIG. 34, and

DETAILED DESCRIPTION OF PREFERRED EMBODIMENT

A preferred embodiment of this invention is explained with reference to the accompanying drawings.

Figure 1:
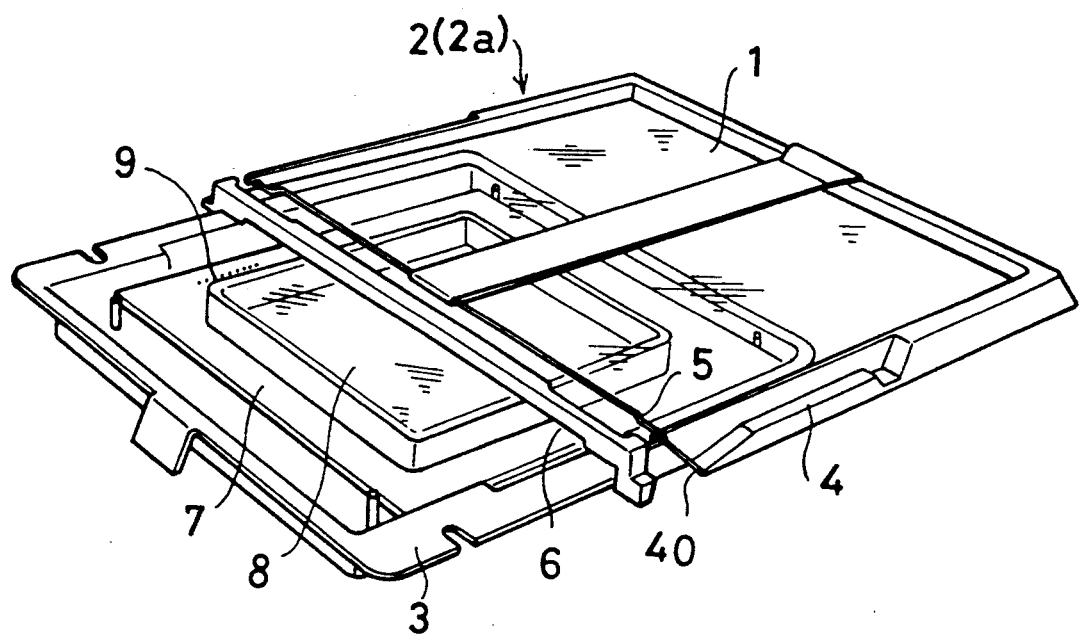
FIGS. 1 and 2 are perspective views of reticle cases.
Figure 2:
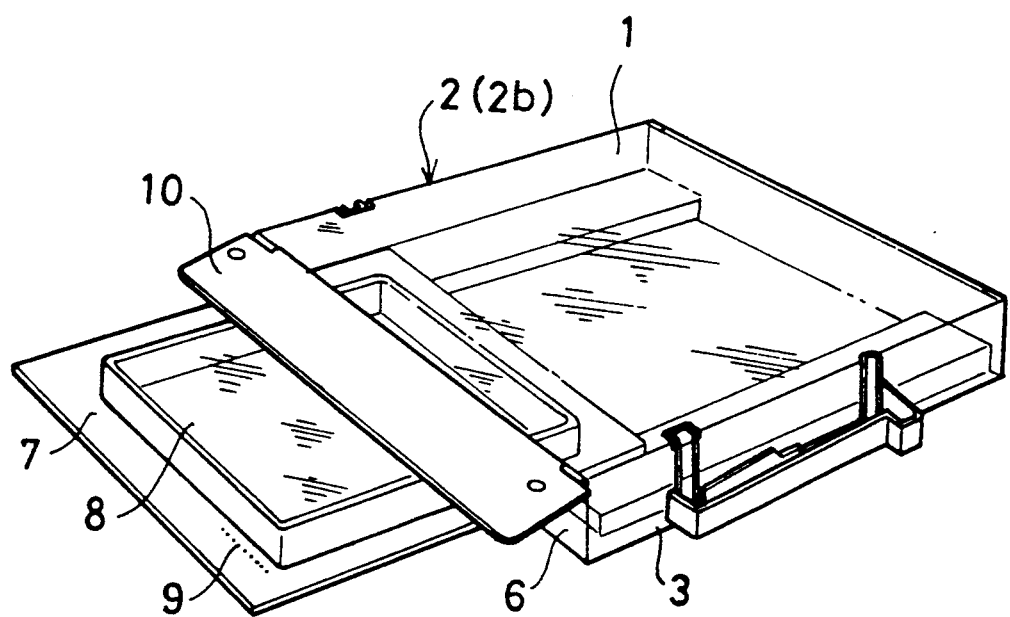
Figure 3:
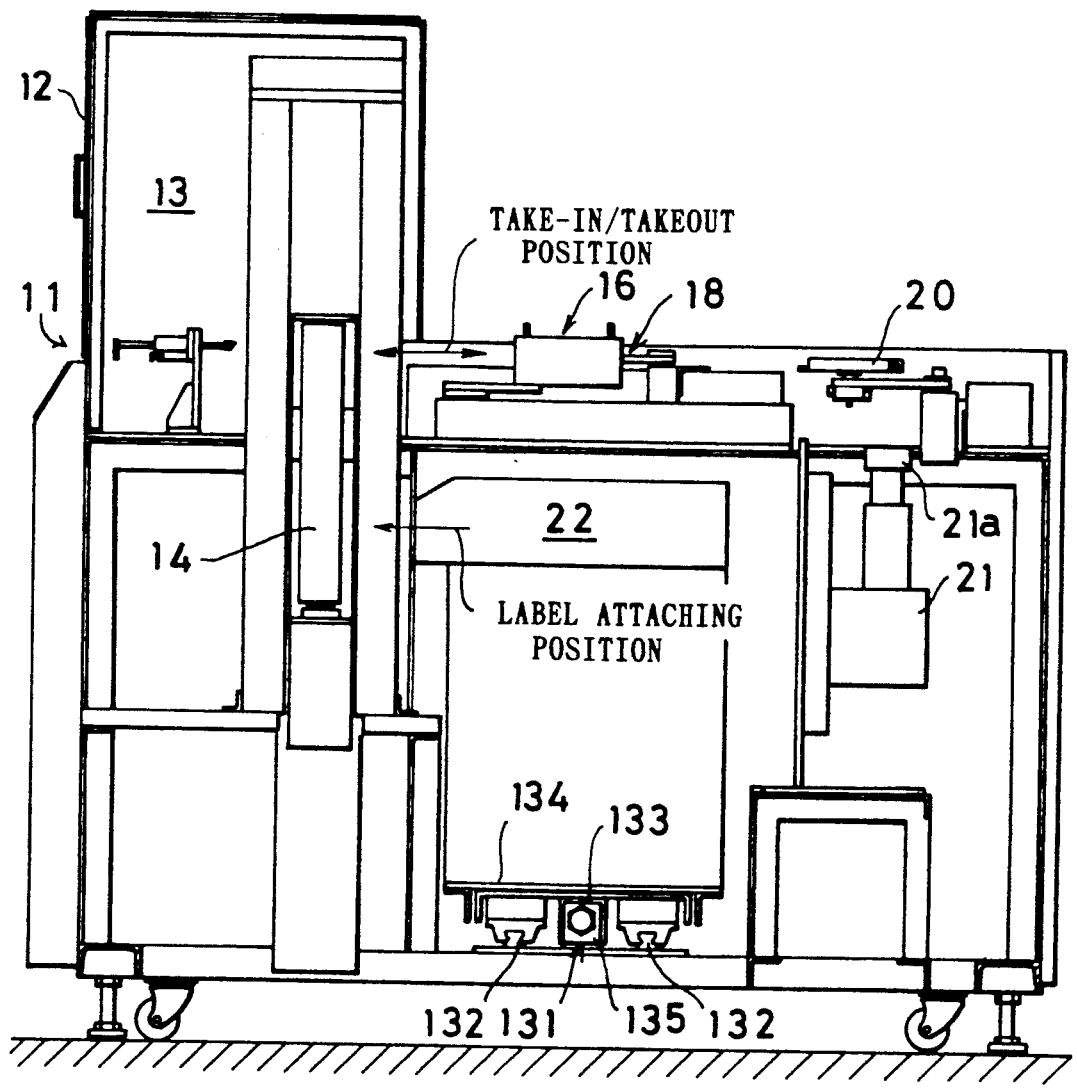
FIG. 3 is an overall general side view of an embodiment of this invention apparatus.
Figure 4:
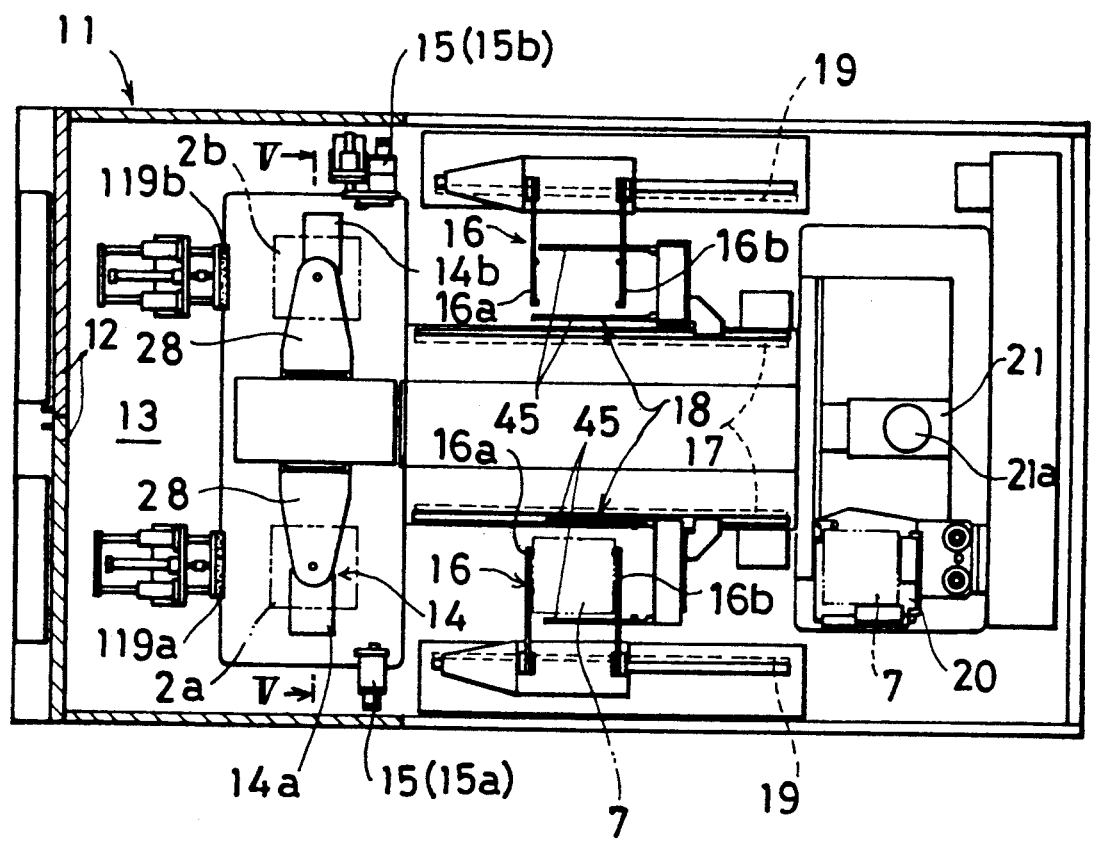
FIG. 4 is an overall general plan view of FIG. 3.

FIGS. 3 and 4 show overall general views of an apparatus 11 for attaching bar codes to reticle cases according to this invention. In this apparatus, a rack-shaped elevating base 14 is disposed inside a box 13 which is provided, on its rear side, with transparent doors 12 that can be opened and closed. A plurality of reticle cases 2 containing therein reticles are placed on each of the shelves of the elevating base 14. In the illustrated example, the elevating base 14 is disposed in two sets in parallel to each other. Reticle cases 2a shown in FIG. 1 are placed in one 14a of the elevating bases and reticle cases 2b shown in FIG. 2 are placed in the other 14b of the elevating bases. On one side of each of the elevating bases 14, there is provided a device 15 for opening and closing the outlet 6 of that reticle case 2 (hereinafter called "opening device" 15) on the elevating base 14 which is stopped at a takeout position. A device 18 for taking in (or inserting) and taking out reticles (hereinafter called "take-in/takeout device" 18), which is driven by a belt for reciprocating along a guide rail 17, is provided in front of the respective elevating bases 14. When the outlet 6 of the reticle case 2 is opened, this take-in/takeout device 18 proceeds into (or enter) the reticle case 2, lifts either the body part 3 containing the reticle therein or the reticle 7 itself, and conveys the body part 3 or the reticle 7 to an outside position where transfer devices 16, 16 are kept waiting. Each of the transfer devices 16, 16 is provided with a pair of arms 16a, 16b whose distance can be widened and narrowed. The reticle 7 is transferred between the transfer device 16 and the take-in/takeout device 18 through the widening and narrowing movements of the arms 16a, 16b. Each of the transfer devices 16, 16 reciprocates to and from a position where a carrying base 20 is kept waiting, along a separate guide rail 19 which is provided in parallel with the above-mentioned guide rail 17.

The carrying base 20 receives the reticle 7 from each of the transfer devices 16, 16 and transfers the reticle 7 in front of a reading device 21 so that the reading device 21 can read out the code number 9 marked on the reticle 7. The carrying base 20 is moved by a driving device comprising a timing belt which is described later. It moves up and down to hand over the reticle 7 between the transfer device 16. It also rotates to position the code numbers, which vary with reticles of different kinds, in a position in front of the reading means 21.

The reading device 21 optically reads out the code number 9 which is marked on the reticle 7 and transmits the signal, via a computer, to a printer of a label attaching device 22 which is provided in front of and below the elevating base 14.

The label attaching device 22 attaches a label which is subjected to printing by the printer, to the outside of the reticle case 2 in which the reticle 7 was contained. For this label attaching work, the elevating base 14 is lowered to a label attaching position which is located below the reticle takeout position.

Figure 5:
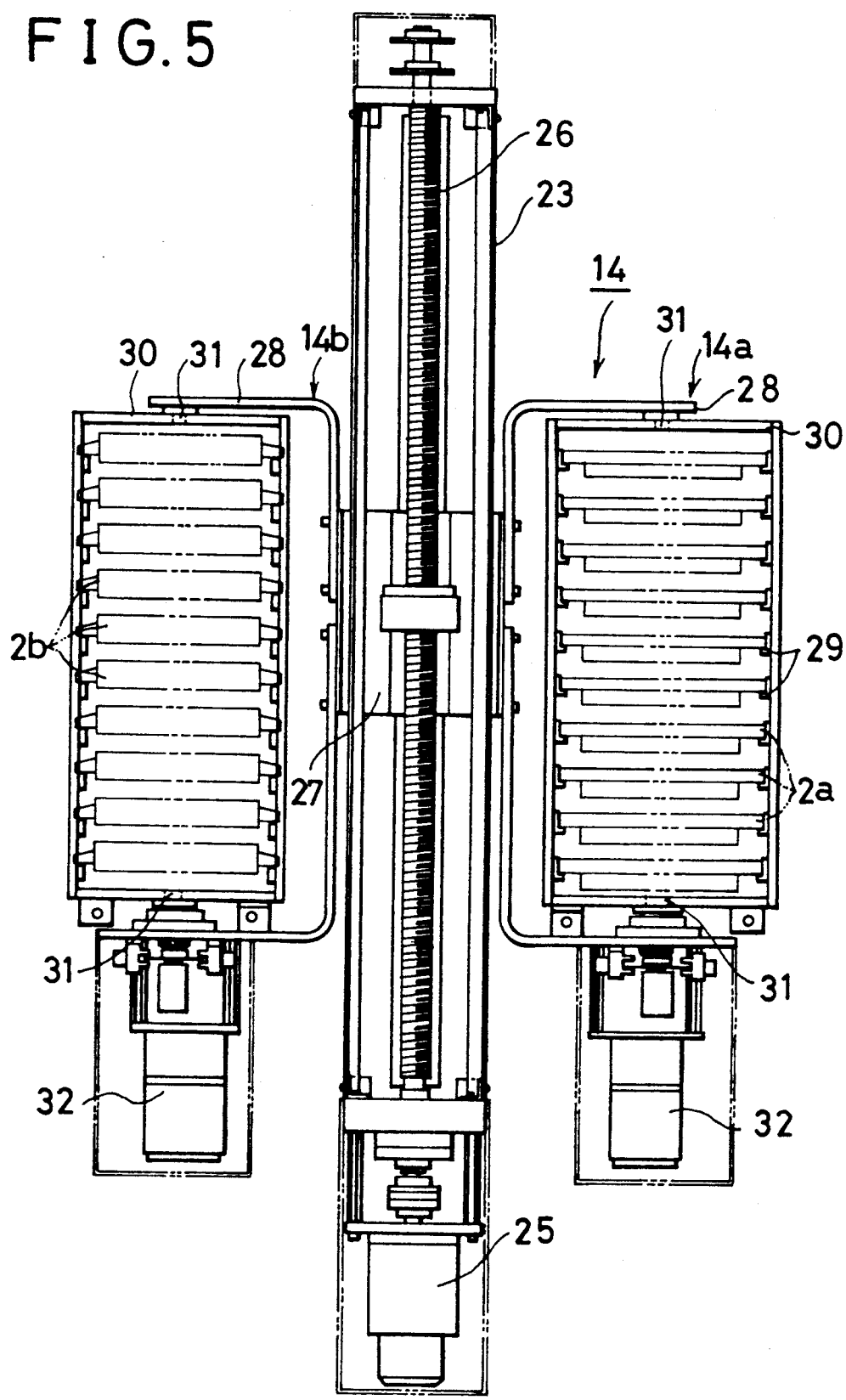
FIG. 5 is a detailed view of an elevating base portion taken along the line V—V of FIG. 4.
Figure 6:
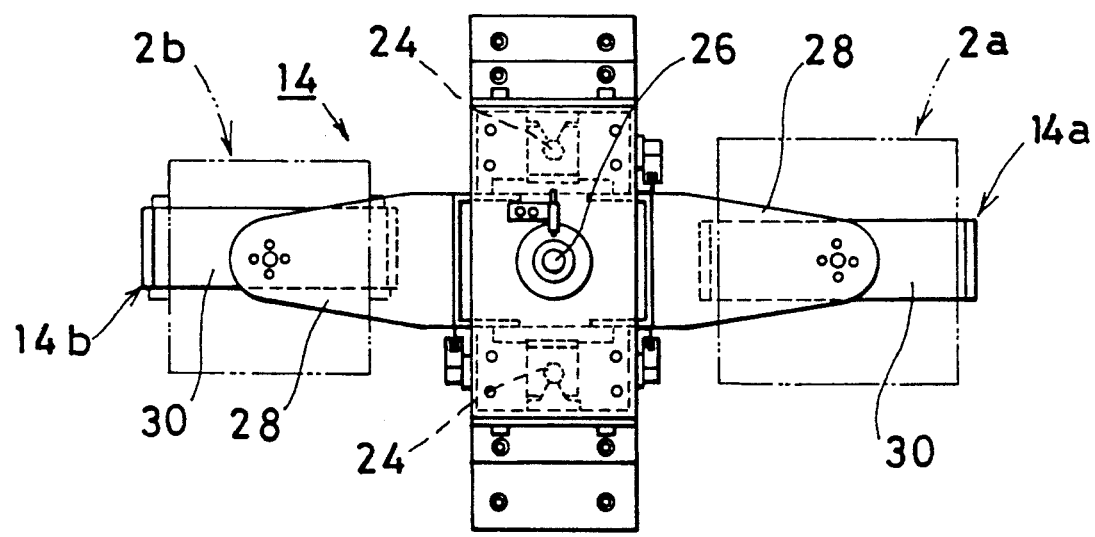
FIG. 6 is a plan view of FIG. 5.

Details of the elevating base 14 are shown in FIGS. 5 and 6. There are provided in a vertical direction of an elevating base frame 23 two pieces of guide bars 24 and a rotatable threaded bar 26 to be rotated by an electric motor 25. On both sides of a base plate 27 which engages with the threaded bar 26 and slides along the guide bars 24, there are attached arms 28, 28 which are respectively branched into two. In the branched space of each of the arms 28, 28 there is provided a rack 30 which has therein 10 pieces of shelves 29 for containing therein reticle cases 2 and which is left open in the rear and front ends. Each rack 30 is rotatably supported by upper and lower shafts 31. Each shaft 31 is fixed to the rack 30. The lower shaft 31 is rotatable by 180 degrees by an electric motor 32 which is mounted on a lower part of the arm 28. When the threaded bar 26 is rotated by the electric motor 25 mounted on the elevating base frame 23, the racks 30 are moved up or down along the guide bars 24. A reticle case 2 in a predetermined one of the shelves 29 is thus positioned in the take-in/takeout position or the label attaching position.

Figure 7:
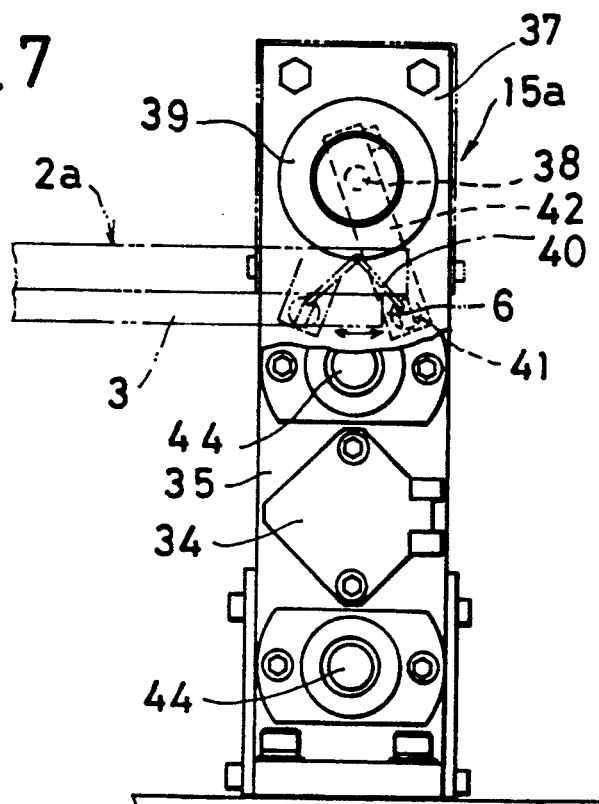
FIG. 7 is a detailed front view of one of opening devices.
Figure 10:
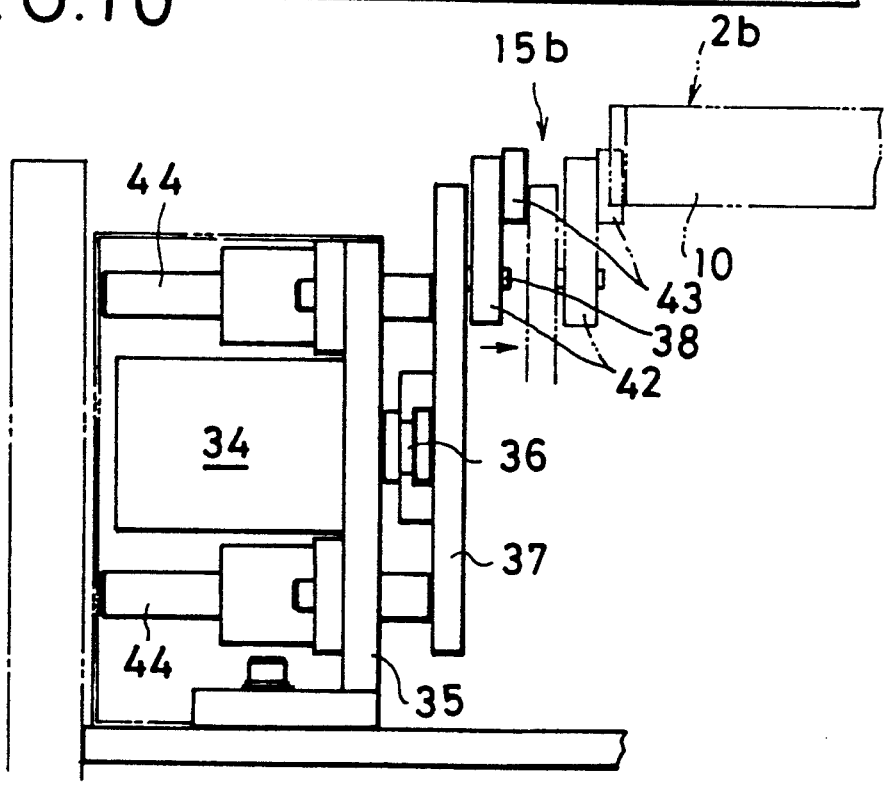
FIG. 10 is a side view of FIG. 9.

Details of the opening devices 15a, 15b to be provided in front of each elevating base 14 are shown in FIGS. 7 through 10. The construction of the opening device 15a for opening the outlet 6 of the reticle case 2a shown in FIG. 1 is shown in FIGS. 7 and 9, and that of the opening device 15b for opening the outlet 6 of the reticle case 2b shown in FIG. 2 is shown in FIGS. 8 and 10. Each of the opening devices 15a, 15b is provided with an air cylinder 34 which is mounted on a stationary frame 35, a plate 37 which is attached to a rod 36 of the air cylinder 34 and is reciprocated sideways guided by guide bars 44, 44 through projecting and retracting movements of the rod 36, and an electric motor 39 having a rotary shaft 38 which passes through the plate 37. In the example shown in FIGS. 7 and 9, the rotary shaft 38 has an engaging piece 41 which is provided via a connecting arm 42 off the central axis of the rotary shaft 38, in order to swing the pin 40 which extends from the lock 5 of the reticle case 2a of FIG. 1. When a predetermined reticle case 2a is positioned in the reticle takeout position of the elevating base 14, the rod 36 of the air cylinder 34 extends laterally forwards and then the electric motor 39 rotates. The engaging piece 41 thus rotates together with the engaging pin 40 to disengage the lock 5. The reticle 7 is therefore in a condition to be taken out of the reticle case 2a together with the body part 3.

In the example shown in FIGS. 8 and 10, the rotary shaft 38 has a roller 43 which is provided via a connecting arm 42 off the rotary shaft 38 in order to open the side plate 10 of the reticle case 2b by swinging it upwards. In this case, in substantially the same manner as in the case of FIGS. 7 and 8, by the operation of the air cylinder 34 and the electric motor 39, the roller 43 swings so as to push upwards a sidewise protruded end portion of the side plate 10. In this manner, the reticle 7 becomes ready to be taken out by opening the side plate 10.

Figure 11:
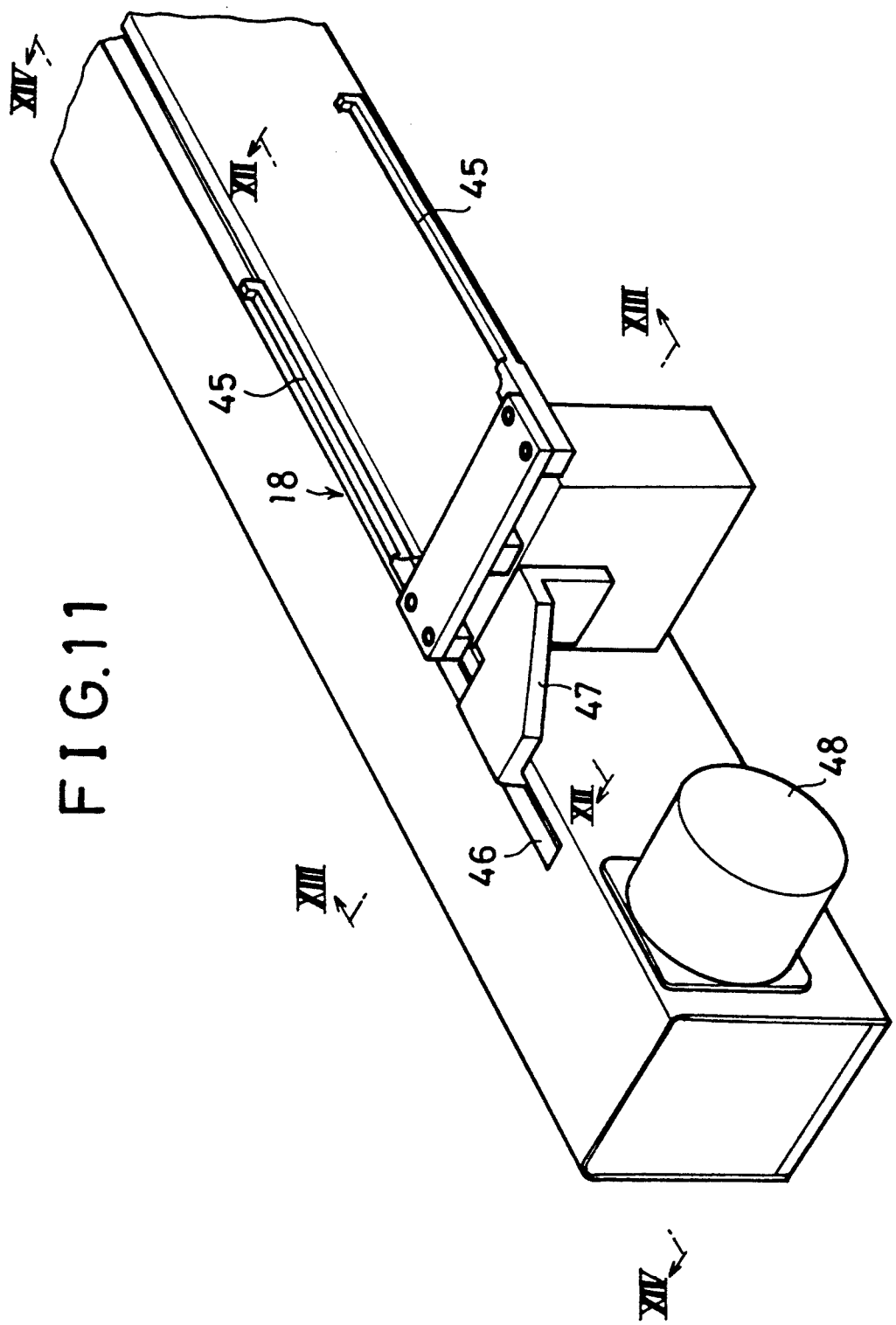
Figure 12:
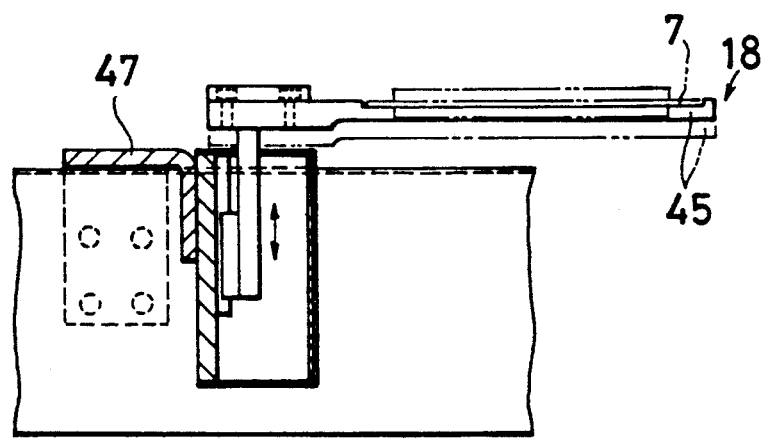
Figure 13:
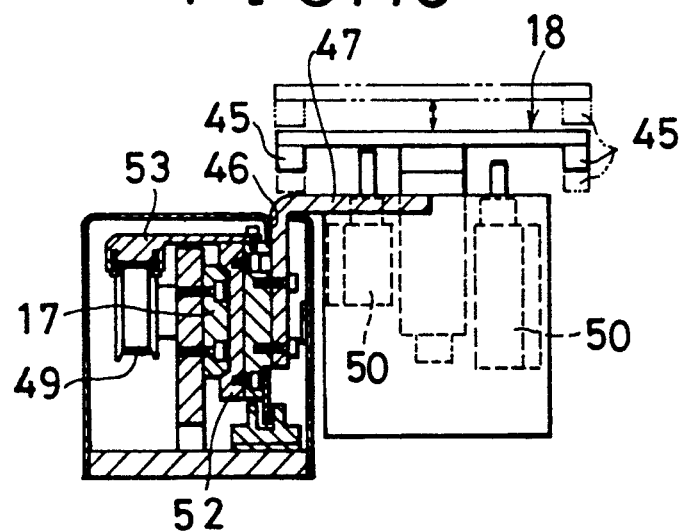
Figure 14:
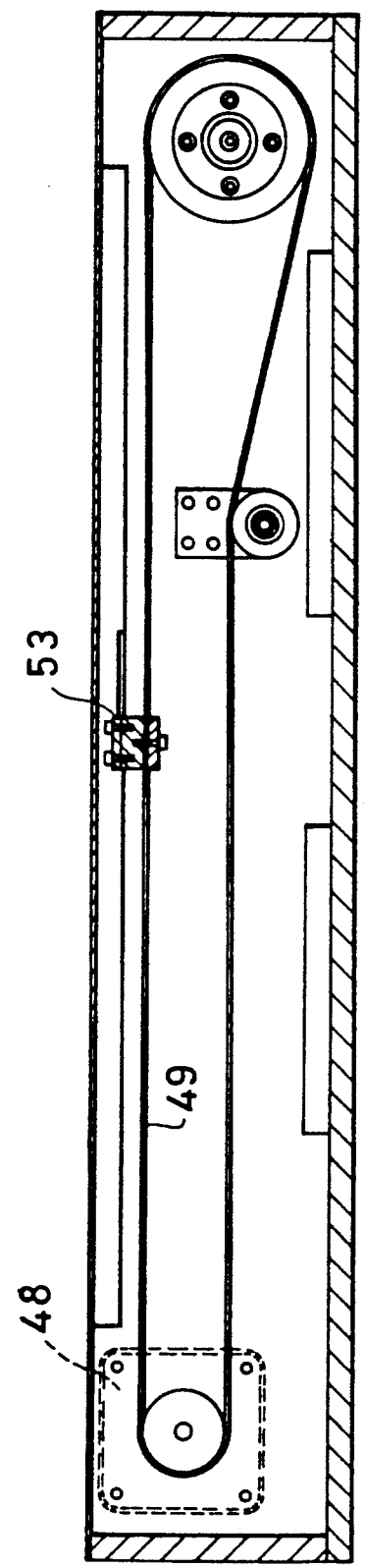

The take-in/takeout device 18 for taking the reticle 7 in, and out of, the reticle case 2 is provided in one set each in front of the respective elevating base 14. The take-in/takeout devices 18, 18 have a symmetrical construction. The construction of one of them is shown in FIGS. 11 through 14. As shown in FIG. 11, the take-in/takeout device 18 comprises fork-shaped takeout arms 45 having a distance corresponding either to the width of the body part 3 of the reticle case 2 or to the width of the reticle 7, as well as a plate member 47 which linearly reciprocates along a groove 46. This plate member 47 is reciprocated by being attached to a belt 49 which is rotatably driven by an electric motor 48. The takeout arms 45 are vertically moved in two steps by two pieces of electromagnetic actuators 50 which are fixed to the plate member 47. The plate member 47 is attached to a sliding piece 52 which is fitted into a guide rail 17 of trapezoidal cross section, as well as to a connecting arm 53 which is attached to the belt 49.

When, by the travelling of the belt 49, the takeout arms 45 enter a reticle case 2 on the elevating base 14 through the opened outlet 6, the takeout arms 45 are moved upwards by the electromagnetic actuator 50 in order to lift the body part 3 or the reticle 7 within the reticle case 2. The takeout arms 45 are then retreated out of the reticle case 2 while holding the body part 3 or the reticle 7 in a lifted condition. Thereafter, after the arms 45 have been lowered by the return movement of the electromagnetic actuator 50, the takeout arms 45 travel to a transfer (or handing over) position in which the reticle 7 is transferred (or handed over) to and from the transfer device 16. At the transfer position, the takeout arms 45 are elevated in two steps to make themselves ready for handing over the reticle 7 to the transfer device 16. In case the body part 3 or the reticle 7 held on the arms 16 is returned to the reticle case 2, the takeout arms 45 are moved upwards by the electromagnetic actuator 50 before the takeout arms 45 enter the reticle case 2. Under these conditions, the takeout arms 45 proceed into the reticle case 2 and are moved downwards inside the reticle case 2 by the actuator 50. The takeout arms 45 then travel to a predetermined position outside the reticle case 2 and stop there to keep themselves waiting for taking out of the next body part 3 or the reticle 7.

Figure 15:
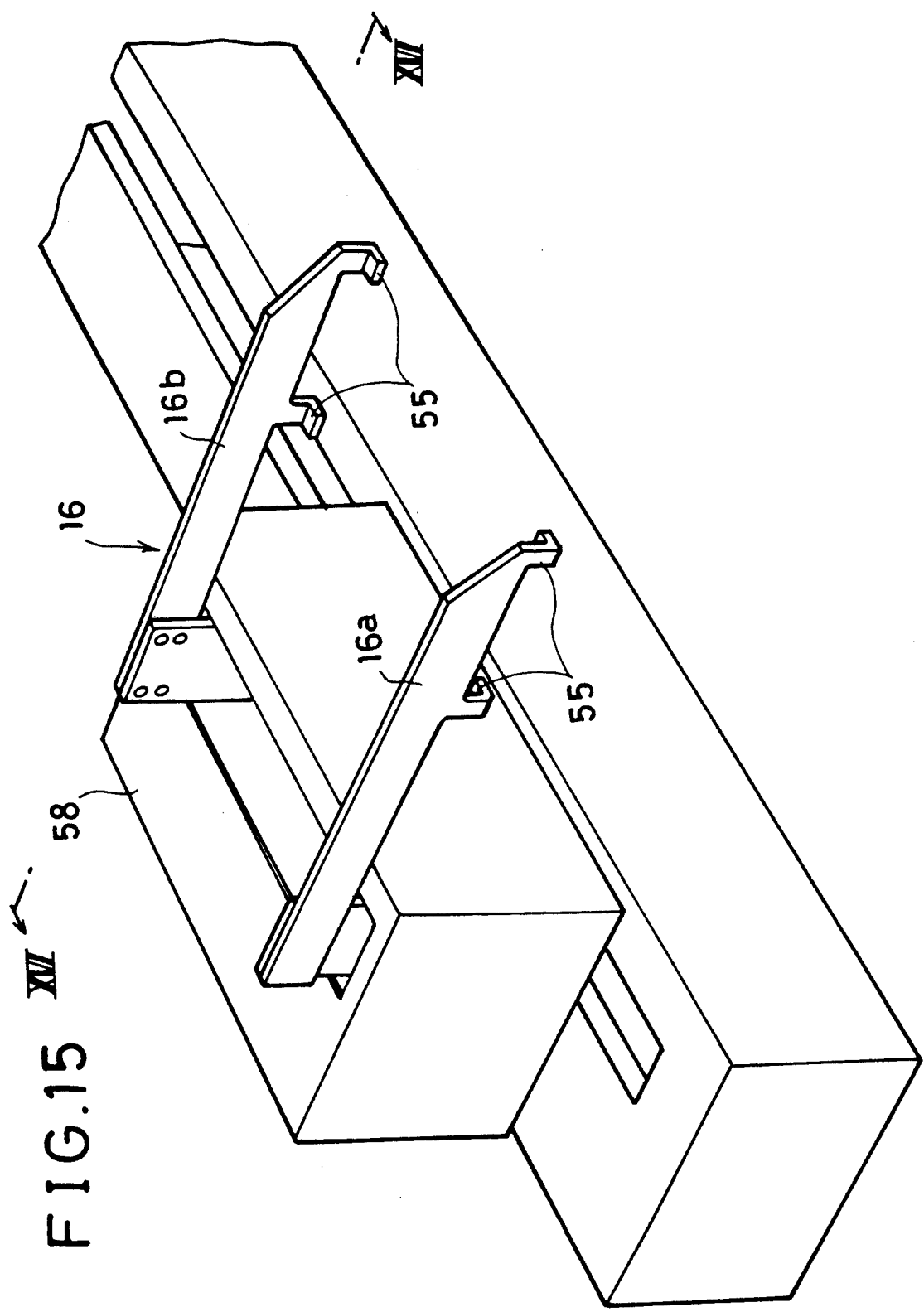
FIG. 15 is a perspective view of an important portion of the transfer device.
Figure 16:
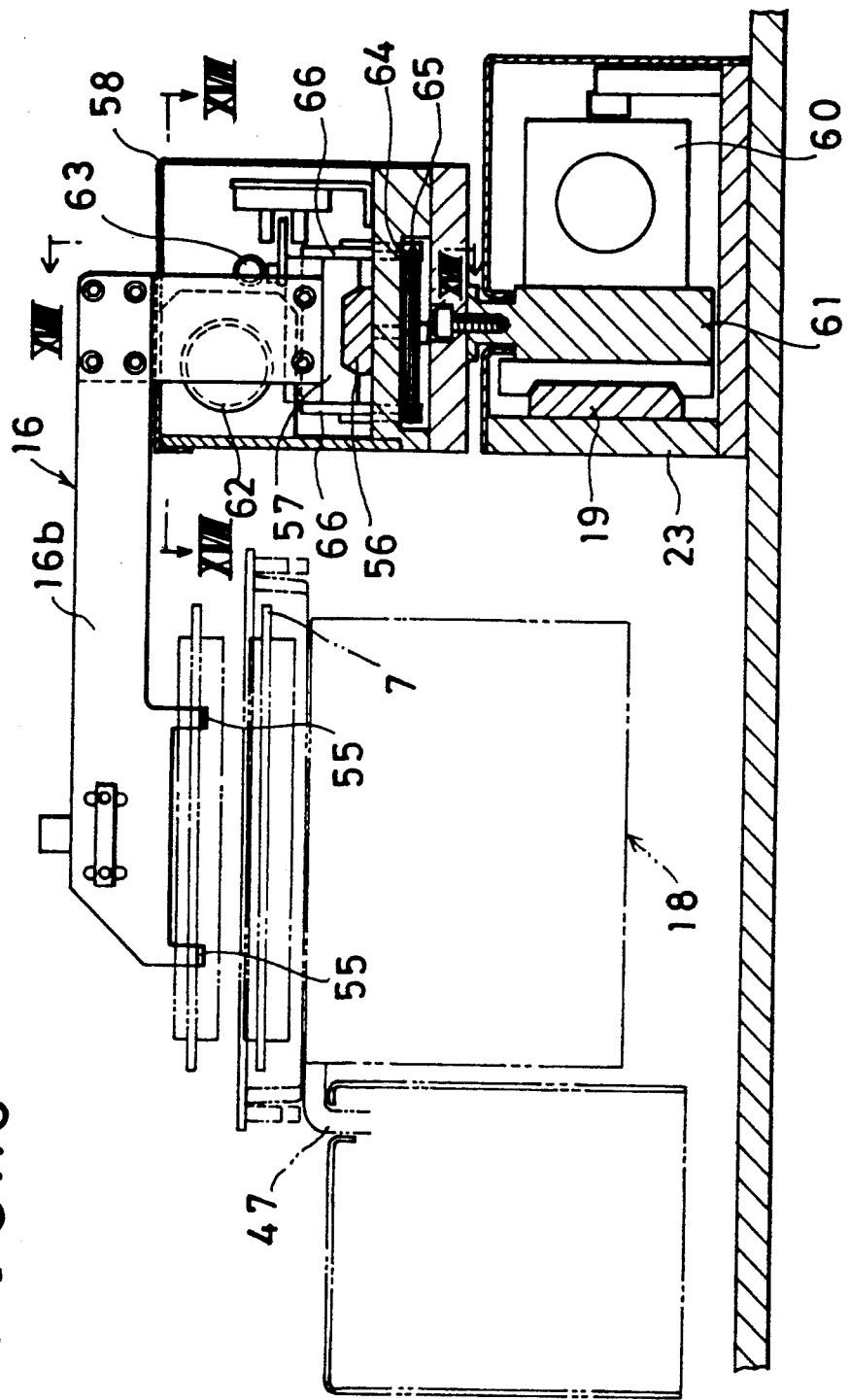
FIG. 16 is a sectional side view taken along the line XVI—XVI of FIG. 15.
Figure 17:
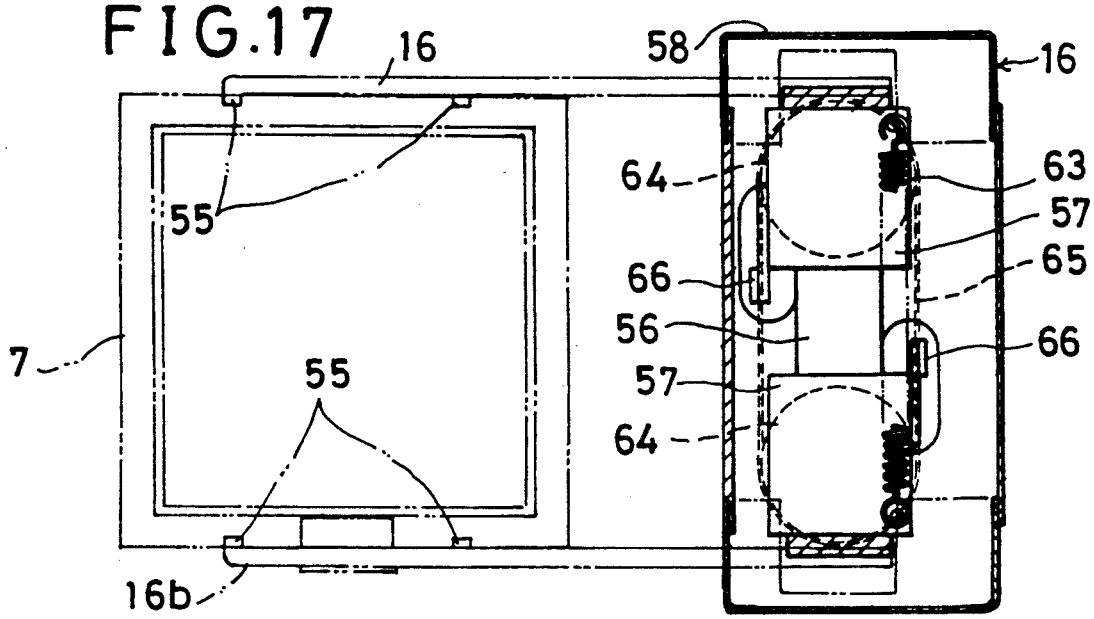
FIG. 17 is a sectional plan view taken along the line XVII—XVII of FIG. 16.
Figure 18:
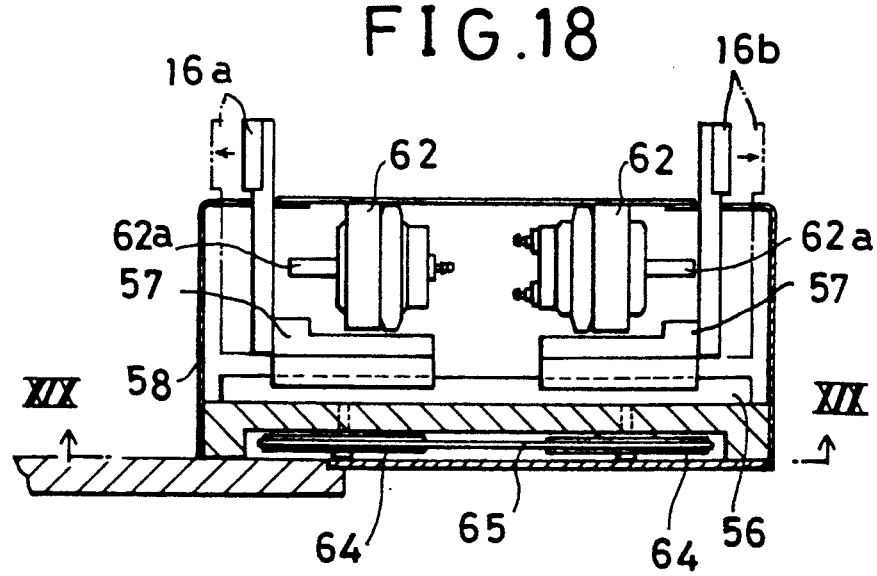
FIG. 18 is a sectional view taken along the line XVIII—XVIII of FIG. 16.
Figure 19:
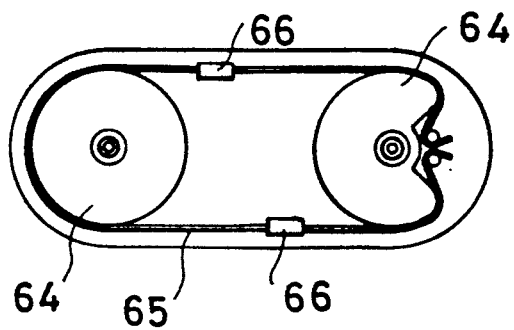
FIG. 19 is a plan view taken along the line XIX—XIX of FIG. 18.
Figure 20:
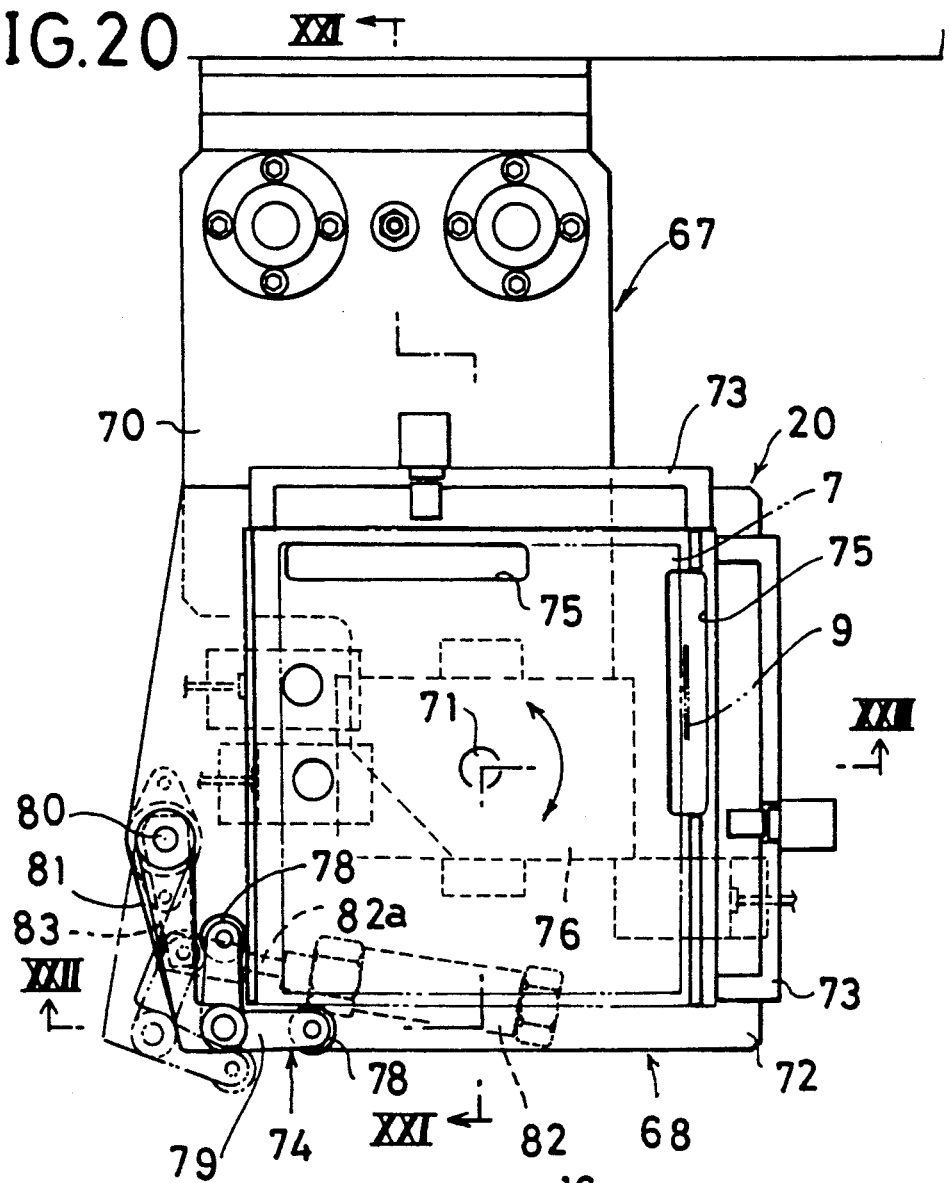
Figure 22:
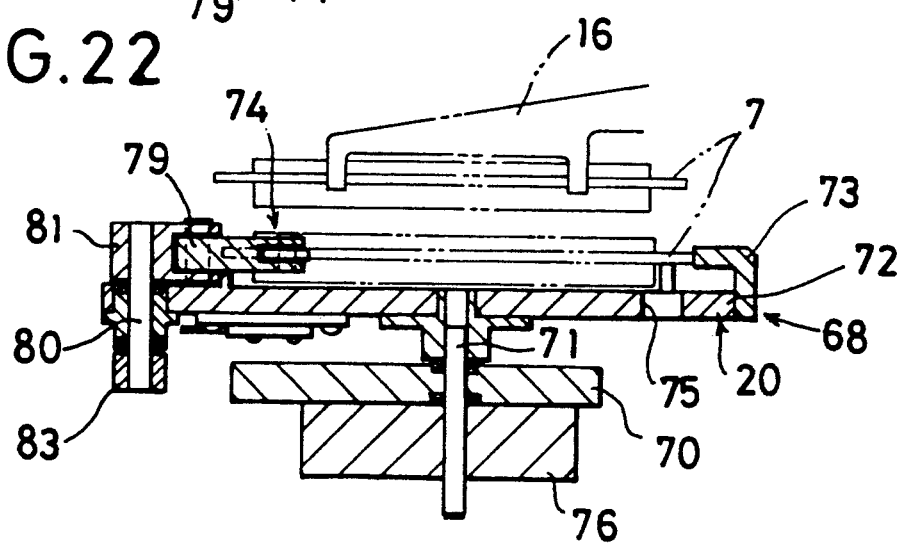

The transfer device 16 transfers the reticle 7 from the take-in/takeout device 18 to and from the carrying base 20. Even if the reticle 7 is taken out together with the body part 3, the transfer device 16 picks up only the reticle 7 and transfers it to the carrying base 20. Two sets of the transfer means 16 as shown in the embodiment have a symmetrical construction. One of them is shown in detail in FIGS. 15 through 19. The transfer means 16 has, as shown in FIG. 15, a pair of arms 16a, 16b which are provided at their two front portions with inwardly bent claws 55. As shown in FIG. 16, each of the arms 16a, 16b is fixed at its root portion to a base 57 which reciprocates along a guide bar 56 of trapezoidal cross section inside a box-type movable frame 58. The base 57 inside the movable frame 58 is attached to a joint block 61 which reciprocates by an air cylinder 60 along the guide rail 19 of trapezoidal cross-section which is longitudinally provided on a transfer device frame 23. The base 57 reciprocates together with the joint block 61. In the movable frame 58 there are fixed two sets of small-sized air cylinders 62 which are positioned between the arms 16a, 16b as shown in FIG. 18. When air is supplied to each of the air cylinders 62, a rod 62a projects to push each of the arms 16a, 16b outwards at its root portion, and the distance between the arms 16a, 16b becomes larger. When air in the small-sized air cylinders is discharged, the arms 16a, 16b will return to their original positions by means of the resiliency of a spring 63 which extends between the bases 57. In order to perform the movement of the bases 57 synchronously, a pair of pulleys 64, 64 having an endless wire 65 extended therebetween are provided under the movable frame 58, as shown in FIG. 19. On opposite sides of the wire 65 there are attached fixing pieces 66 which extend from each of the bases 57. When each of the bases 57 moves by a push from the small-sized air cylinder 62, the wire 65 also moves to one direction, thereby preventing either one of the bases 57 from delaying in operation. This synchronized operation of the bases 57 enables a synchronized operation of the arms 16a, 16b and consequently secures transferring of the reticle 7 to and from the take-in/takeout device 18.

Figure 21:
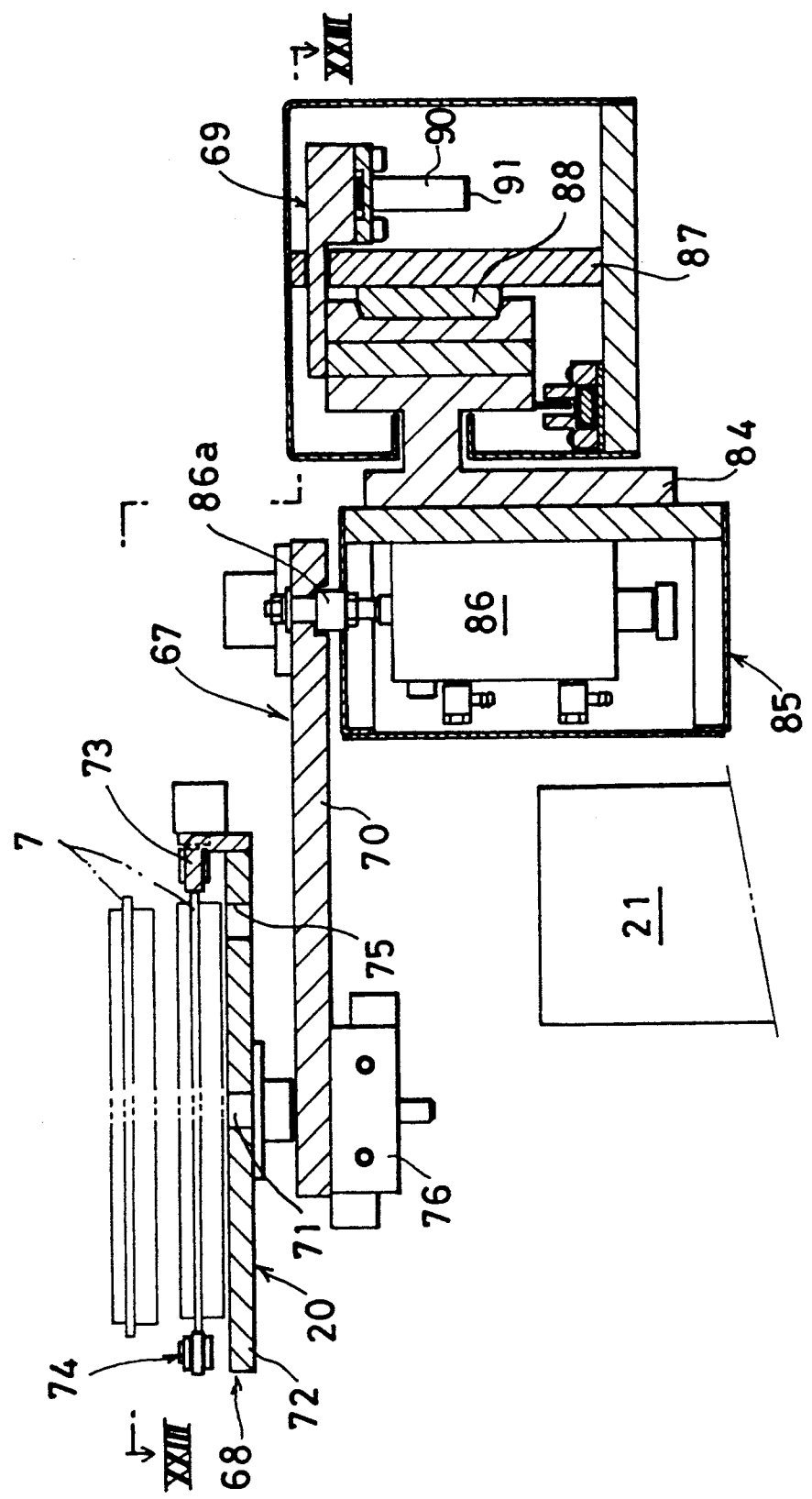

Details of the carrying base 20 are shown in FIGS. 20 through 24. This carrying base 20 comprises a table device 68 and a driving device 69 which are connected together via a movable connection device 67 of substantially L shape in cross section. The table device 68 comprises a square rotatable plate 72 which is attached to a horizontal plate 70 of the movable connection device 67 so as to be rotatable about a rotary shaft 71. The table device 68 further comprises reticle holding members 73 of a channel shape which are respectively provided along two neighboring sides of the upper surface of the rotatable plate 72, a swingable clamp 74 whose tip ends are positioned at the remaining two sides of the rotatable plate 72, and two pieces of slots 75, 75 which are used for reading code numbers threrethrough and which are perforated along the two neighboring sides of the rotatable plate 72. On the rear surface of the horizontal plate 70 of the movable connection device 67, there is provided an electric motor 76 for rotating the rotary shaft 71 by 90 degrees. By its rotation in one and the reverse directions, the entire table device 68 rotates by 90 degrees relative to the movable connection device 67. The clamp 74 comprises crossing arms 79 with rollers 78 at their tip ends, a swing arm 81 whose one end is attached to a shaft 80 vertically provided through the rotatable plate 72 and whose opposite end has attached thereto the crossing arms 79, and a driving arm 83 whose one end is attached, under the rotatable plate 72, to the shaft 80 and whose opposite end is connected to a rod 82a of an electromagnetic actuator 82. The movable connection device 67 comprises the aforementioned horizontal plate 70, a box 85 which is connected to a moving element 84 of the driving device 69 and an air cylinder 86 fixed inside the box 85 and having a rod 86a which is connected to the plate 70. The driving device 69 has a construction which is substantially similar to that of the take-in/takeout device 18. As shown in FIGS. 21, 23 and 24, the driving device 69 comprises the aforementioned moving element 84 which is movable along a guide bar 88 which is attached to one side surface of a laterally extending driving device frame 87, a belt 91 which extends between a pair of pulleys 90 which are attached to the other side surface of the driving device frame 87 and an electric motor 92 for rotating one of the pulleys 90. The moving element 84 is attached to the belt 91.

An optical reading device 21 is provided in a lengthwise (i.e., laterally if seen in the entire apparatus) intermediate portion of the driving device 69.

When the reticle 7 is placed from one of the transfer devices 16 which is in use to the rotatable plate 72, the clamp 74 firmly holds the reticle 7 in position against the reticle holding pieces 73. When the belt 91 of the driving device 69 moves, the carrying base 20 moves together with the movable connection device 67, and reciprocates to a position above the reading device 21. The reticle 7 is placed by the transfer means 16 such that the code number 9 is positioned in the slot 75 of the rotatable plate 72.

The position of the code number 9 to be marked on the reticle 7 as shown in FIG. 1 is different from that shown in FIG. 2. A camera 21a of the reading device 21 is fixed after focusing on one of the slots 75 which is directly visible from the camera 21a. When the code number is positioned in the slot 75 that is invisible from the reading device 21, the rotatable plate 72 is rotated by 90 degrees by the electric motor 76 which is provided on the rear side of the plate 70 of the movable connection device 67. In this way, the reading device 21 becomes focused on the slot 75 which was out of focus.

In the neighborhood of the reading device 21 there is provided a lighting device 93 for illuminating the code number 9 through the slot 75. The code number 9 optically read out by the reading device 21 is converted to an electric signal and is transmitted to the label attaching device 22 via a host computer.

Figure 29:
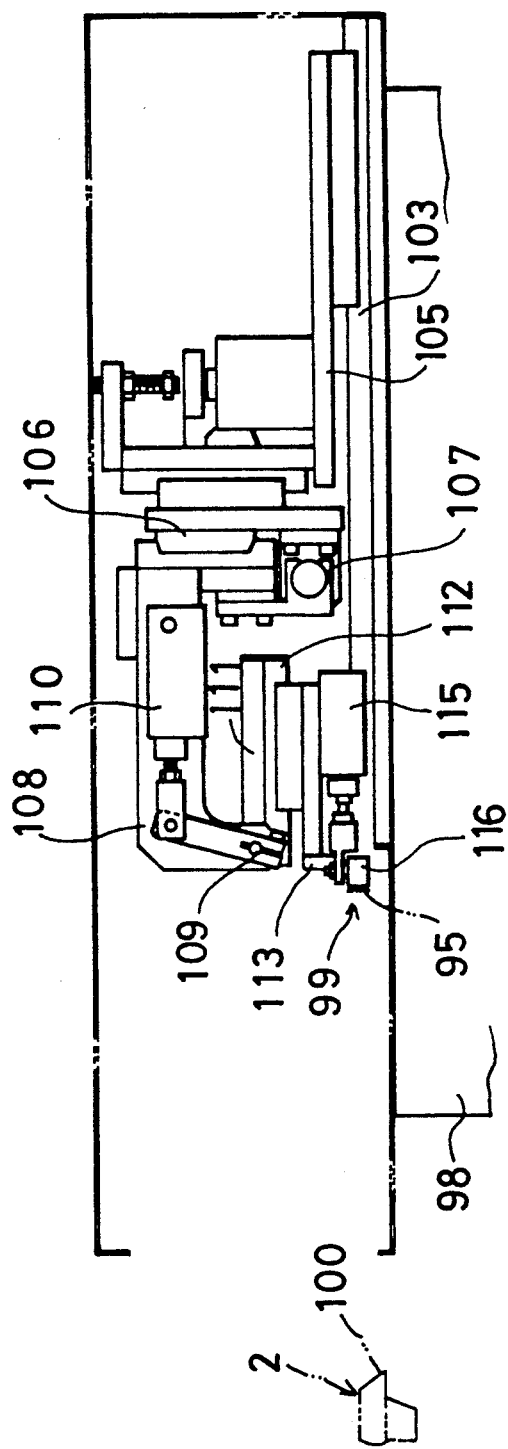
Figure 30:
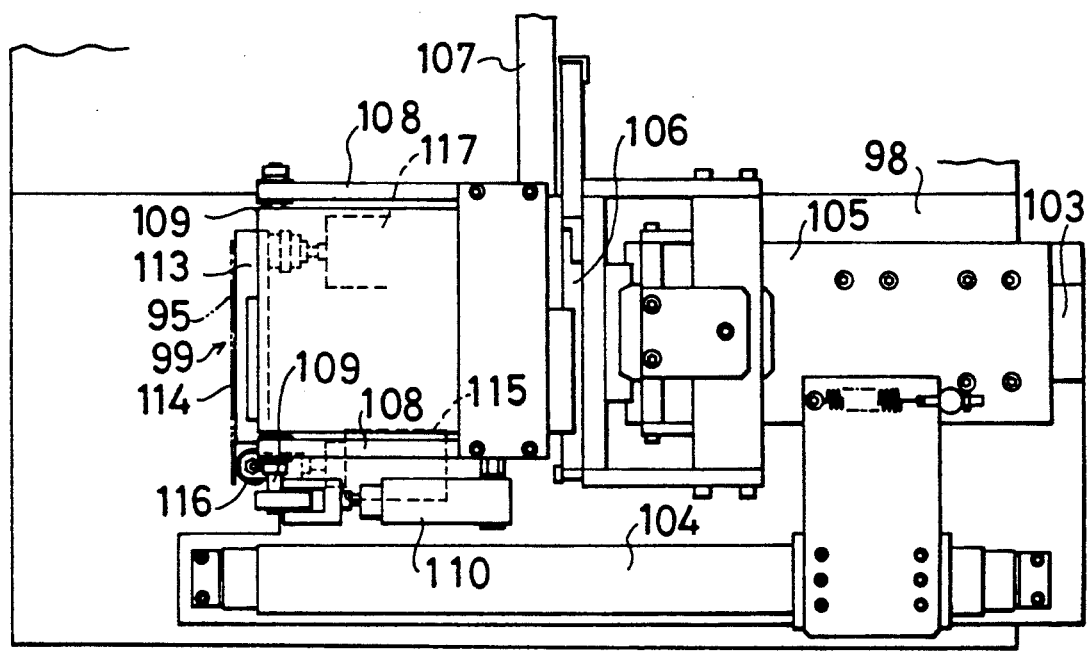
Figure 31:
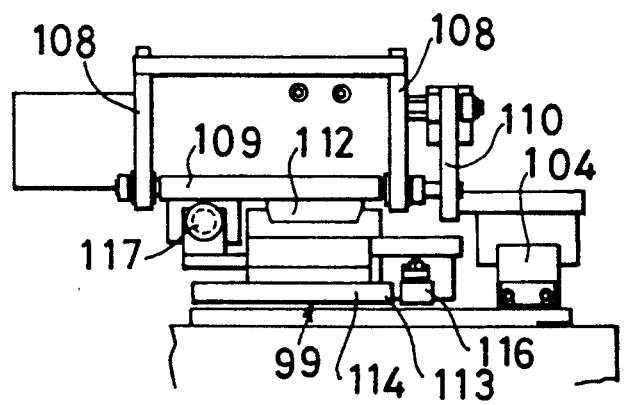

The label attaching device 22 is constructed as shown in FIGS. 29 through 31. It is provided with a printer 98 which sequentially feeds labels 95 which are attached to a long piece of released paper as shown in FIG. 25, and which have pressure-sensitive adhesive layers on the rear surfaces thereof. The printer 98 prints, according to the signals from the host computer, those bar codes 96 and marks 97 on the labels 95 which correspond to the code numbers 9 as shown in FIG. 26.

The labels 95 having bar codes 96 printed thereon are released from the released paper 94 and are transferred to a label attaching head 99. The label attaching head 99 then attaches the labels 95 to side surfaces of reticle cases 2, i.e., empty cases 2 from which reticles 7 have been taken out. In order for the labels 95 to be attached to the reticle cases 2, the elevating base 14 is lowered from the takeout position as shown in FIG. 3 such that the reticle case 2 is positioned in the label attaching position facing the label attaching head 99.

When the rack 30 of the elevating base 14 is turned 180 degrees by the electric motor 32, the reticle cases 2 placed on the rack 30 are also turned such that the side surfaces opposite to the outlets 6 face the label attaching head 99. Therefore, by operating the label attaching head 99 twice, i.e., before and after the rotation of the rack 30, labels 95 can be attached to the front and rear surfaces of the reticle case as shown in FIGS. 27 and 28. There are two label attaching positions; one is on an inclined surface 100 or a corner portion 101 as shown FIG. 27 and the other is on plane surfaces 102, 102 as shown in FIG. 28. In order to enable to attach labels 95 in both cases, the label attaching head 99 is constructed as shown in FIGS. 29 through 31. Namely, the label attaching head 99 comprises a movable frame 105 which reciprocates by an air cylinder 104 along that rail 103 above the printer 98 which is laid towards the reticle case 2, a pair of arms 108 which reciprocate by an air cylinder 107 along a guide bar 106 which crosses the rail 103 and which is provided on the side surface of the movable frame 105, a swing plate 111 which is supported on the arms 108 by a shaft 109 and which can be swung vertically by an air cylinder 110, and a suction head 113 which is movable by an air cylinder 117 along a guide bar 112 provided in the swing plate 111 in the direction of the rail 103. The suction head 113 is formed into a suction port at its front surface 114. To the side of the front surface 114 there is provided a label pushing roller 116 which can project ahead of the front surface 114, as shown in FIG. 29, by an air cylinder 115.

Figure 32:
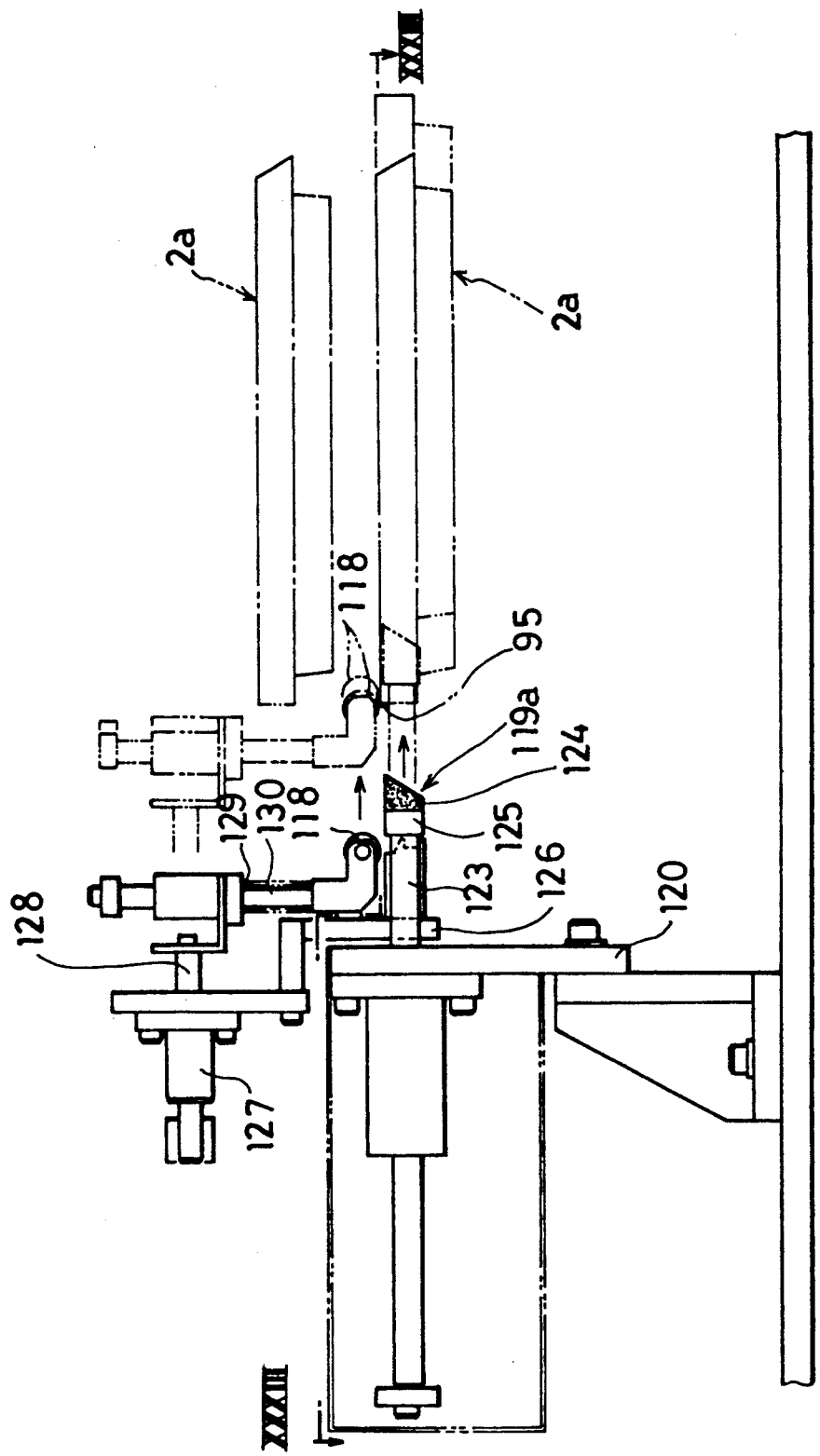
Figure 33:
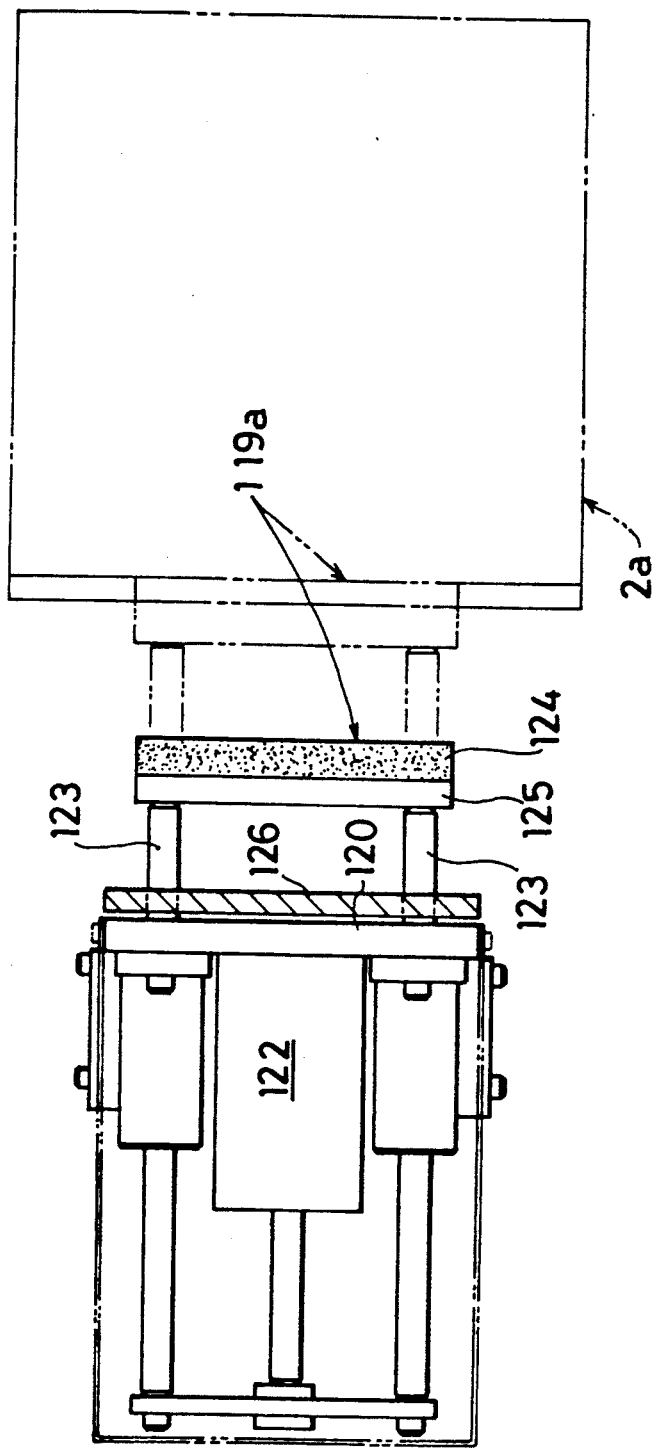

In case a label 95 is attached to the inclined surface 100 of the reticle case 2a shown in FIG. 1, the printed label 95 to be fed from the printer 98 is sucked by the suction head 113. The swing plate 111 of the arms 108 is inclined by the air cylinder 110 such that the front surface 114 of the suction head 113 becomes parallel with the inclined surface 100. Then, the entire label attaching device 22 is made closer by the air cylinder 104 to the reticle case 2a which is positioned ahead of the label attaching device 22, as shown in FIG. 29. The suction head 113 is then moved forwards towards the inclined surface 100 by the air cylinder 117, so that the label's rear surface having an adhesive agent attached thereto is pressed against the inclined surface 100 for attaching. Thereafter, the label attaching device 22 retreats, and the rack 30 of the elevating base 14 rotates so that the side surface which is faces the suction head 113. Then, the suction head 113 sucks a label 95 of the same content as the previous one and moves forwards again to attach the label 95 to the corner portion 101 of the reticle case 2a. When the attaching surface is narrow in width, the label 95 to be attached in the aforementioned operations will partly project beyond the upper edge as shown by dotted lines in FIG. 27. In order to completely attach this projected portion, as shown in FIG. 4, there is provided behind the elevating base 14a a case holding device 119a, having a roller 118 which can be reciprocated, so as to press the projected portion of the label 95 which has been attached to the reticle case 2a. Details of the case holding device 119a are shown in FIGS. 32 and 33. A supporting leg 120 is provided in a position which is opposite, via the reticle case 2a, to the label attaching head 99 of the label attaching device 22. Rods 123 which move by air cylinders 122 towards and away from the reticle case 2a are attached to the supporting leg 120. At the front end of the rods 123 there is attached a holding plate 125 which is provided with a cushion 124. The rods 123 have fixed thereto a moving plate 126 which extends upwards. The roller 118 is attached to a rod 128 of an air cylinder 127 which is provided on the moving plate 126. After the holding plate 125 has pressed the label 95 that is attached to the reticle case 2a by the operation of the air cylinder 122, the roller 118 moves further forwards by the air cylinder 127 to completely press and attach the projected label 95 to the reticle case 2a. The roller 118 is supported on the rod 128 via a supporting shaft 130 which is resiliently held by a spring 129 so as to be movable up and down.

The case holding device 119a operates to push the side surface of the reticle case 2a whenever a label 95 is attached by the label attaching device 22.

Figure 34:
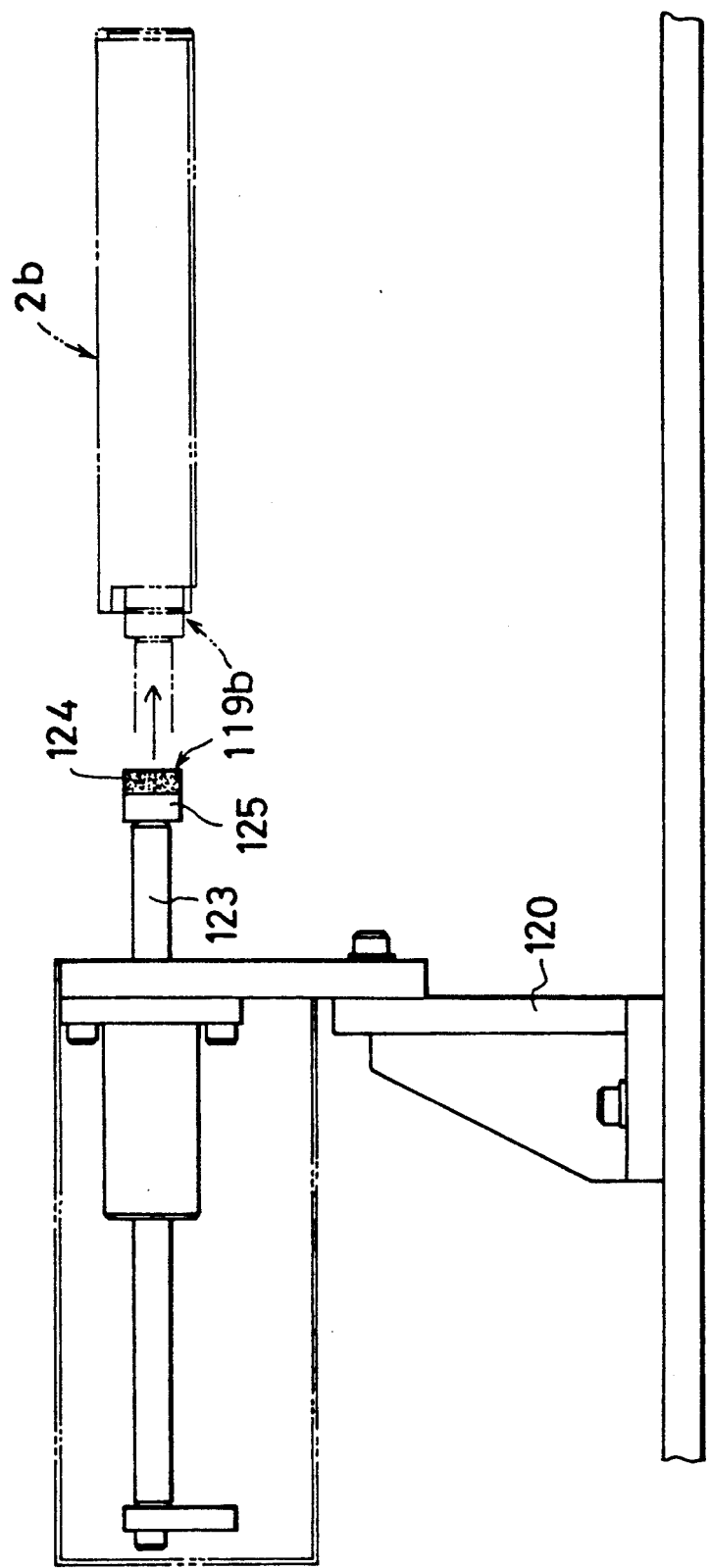
Figure 35:
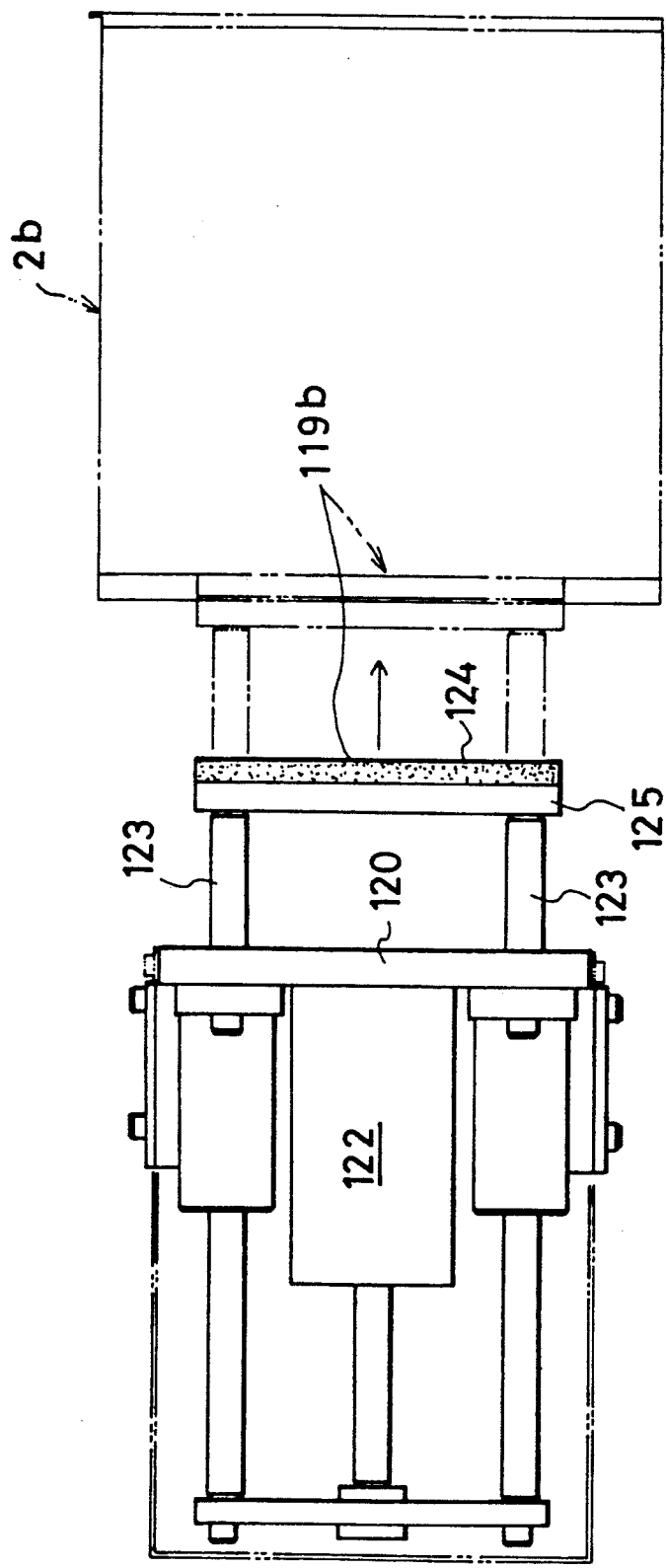

In case the label 95 is attached to the reticle case 2b shown in FIG. 2, the swing plate 111 moves forwards in a horizontal posture as shown in FIG. 29, and attaches the label 95 as shown in FIG. 28. In this case, also, the label 95 is attached to the opposite side surface of the reticle case 2b by the rotation of the elevating base 14b. At that time, the case holding device 119b behind the elevating base 14b moves forwards to press the side surface of the reticle case 2b. Details of the case holding device 119b are as shown in FIGS. 34 and 35. The construction is similar to that of the previously described case holding device 119a without the moving plate 126. The same constituting members as those of the case holding device 119a are shown in the same reference numbers.

The operation of the illustrated embodiment is explained hereinbelow.

First, reticle cases 2a as shown in FIG. 1 are placed on the shelves 29 of the elevating base 14a. Then, the lowermost shelf 29 is stopped in a predetermined position, and the outlet 6 of the reticle case 2a is opened by the opening device 15a. Then, the takeout arms 45 of the take-in/takeout device 18 enters the reticle case 2a through the outlet 6 to lift the reticle 7 and carries it to the position of the transfer device 16 outside the reticle case 2a. The outlet 6 of the reticle case 2a is closed by the opening device 15a after the reticle 7 has been taken out.

The transfer device 16 picks up with the arms 16a, 16b the reticle 7 which is lifted by the take-in/takeout device 18 and then moves to place the reticle 7 on the carrying base 20. The carrying base 20 carries the reticle 7 to the front of the camera 21a of the reading device 21 while holding the reticle 7 with the clamp 74. The code number 9 marked on the reticle 7 is read by the reading device 21. The reading device 21 transmits the signal of the code number 9 to the printer 98 of the label attaching device 22 to print, on the label 95 prepared in the label attaching device 22, a mark comprising the bar code 96 which corresponds to the code number 9.

When the reticle 7 is taken out from the reticle case 2a, the elevating base 14a lowers to wait in a condition that the side surface of the reticle case 2a to which the label 95 is attached is positioned in front of the label attaching device 22. The label 95 with the bar code 96 printed thereon is attached by the label attaching device 22 to a predetermined side surface of the empty reticle case 2a on the elevating base 14a. In case the label 95 is required to be attached to a second side surface of the reticle case 2a, the elevating base 14a is rotated so that the second surface of the reticle case 2a faces the label attaching device 22. The label 95 on which the same code number is printed by the printer 98 is then attached to the second side surface.

When the attaching of labels 95 has been finished, the elevating base 14a is elevated to the original position, i.e., the position in which the reticle 7 was taken out. The outlet 6 of the reticle case 2a is opened again by the opening device 15a, and the reticle 7 which is being held by the take-in/takeout device 18 is taken in or returned to the reticle case 2a.

By repeating the aforementioned operations, it is possible to automatically attach labels 95 to a plurality of reticle cases 2a which are placed on the elevating base 14a, the labels having thereon bar codes 96 corresponding to the code numbers marked on the reticles 7 inside the reticle cases. Even if the code number 9 consists, for example, of 30 digits, it can be represented on the reticle cases without any problem.

Figure 36:
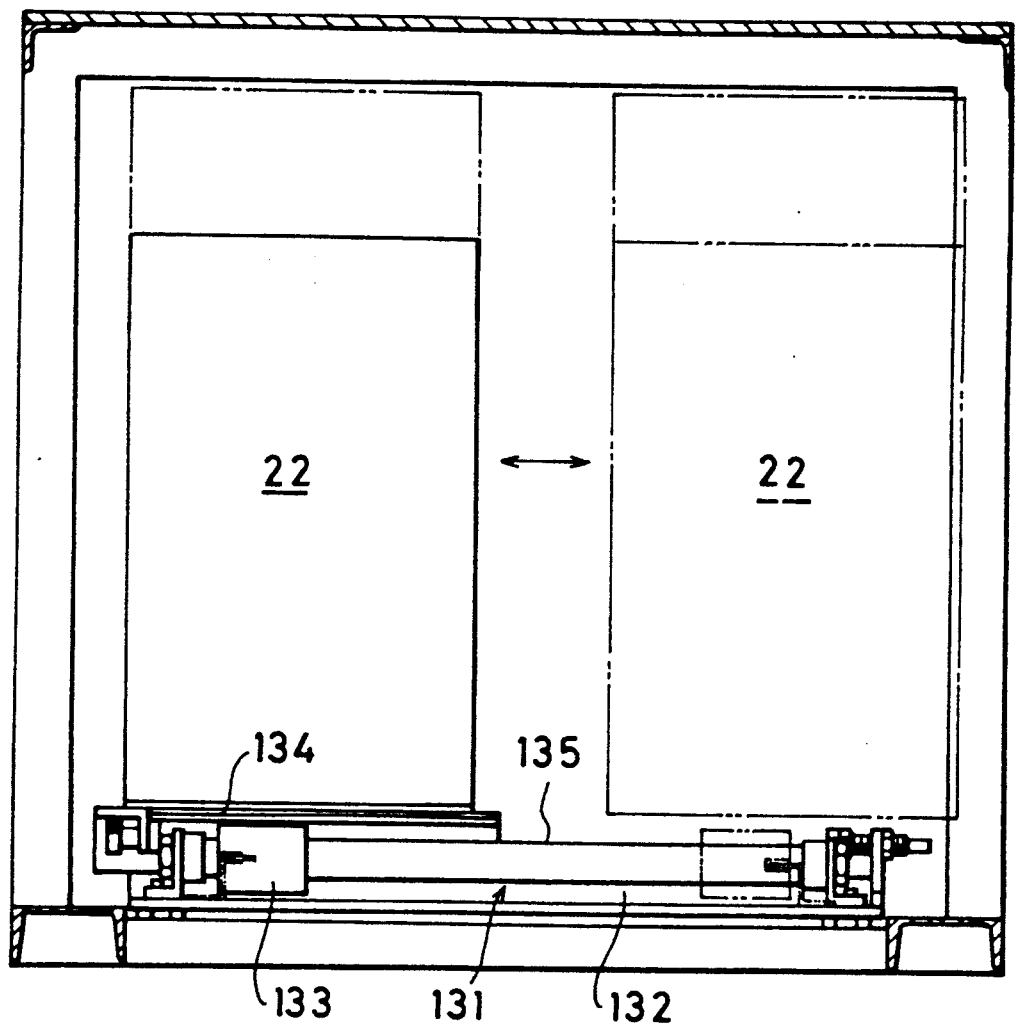
FIG. 36 is a side view of a moving device for the label attaching device.

When the labels 95 with bar codes printed thereon have been attached to the reticle cases 2a placed on one 14a of the elevating bases, a moving device 131 provided at a lower part of the label attaching device 22 as shown in FIGS. 3 and 36, is operated to move the label attaching device 22 from the front of the elevating base 14a to the front of the other elevating base 14b. The moving device 131 comprises a moving base 134 provided with a moving member 133 which moves along two pieces of rails 132, 132. The rails 132 are laterally laid in a lower part in front of the two sets of the elevating bases 14a, 14b. The moving device 131 also has an air cylinder 135 provided underneath thereof for reciprocating the moving base 134.

When the label attaching device 22 is positioned in front of the other elevating base 14b by the operation of the moving device 131, labels 95 are attached to different kind of reticle cases 2b on the elevating base 14b, in the same manner as previously described.

The reticle cases 2 to which labels 95 with bar codes 96 printed thereon have been attached, are kept in a warehouse. When they are needed, a required reticle 7 can be found out in a short time by pointing a bar code reader towards the labels 95 on the reticle cases 2.

As described hereinabove, according to the present invention, there are effects in that small marks marked on the reticle can be automatically represented on the reticle case through the following operations: i.e., the reticle is taken out from inside the reticle case which is placed on the vertically movable elevating base by means of the take-in/takeout device; the reticle is handed over by the transfer device to the carrying base; the carrying base transfers the reticle to the reading device so that the code number marked on the reticle can be read out; a label which has printed thereon a bar code corresponding to a mark read out by the reading device is attached to the reticle case by the label attaching device; and then the reticle is taken in or returned to the reticle case.

It is readily apparent that the above-described invention has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. An apparatus for attaching a bar code to a reticle case comprising:
   at least one elevating base which is movable up and down with the reticle case placed thereon, the reticle case containing therein a reticle so as to be taken in and taken out through an outlet on a side of said reticle case;
   at least one opening means for opening the outlet of the reticle case which is positioned in a predetermined position;
   at least one transfer device;
   at least one take-in/takeout device, said at least one take-in/takeout device for lifting the reticle while the outlet is open and for transferring the reticle between an inside of the reticle case and said at least one transfer device outside the reticle case;
   a reading means;
   a carrying base for receiving the reticle held by said at least one transfer device and moving the reticle to and from a position in from of said reading means for reading a mark which is marked on the reticle for identifying the reticle;
   means for converting a signal of said mark from said reading means to a bar code image corresponding to said mark;
   means for printing said bar code image on a label; and
   label attaching means for attaching to the reticle case the label on which the bar code image has been printed.

2. An apparatus according to claim 1, wherein the at least one elevating base is rotatable.

3. An apparatus according to claim 1, wherein said at least one take-in/takeout device comprises a plate member having a pair of vertically movable fork-shaped takeout arms, and a belt for moving said plate member to and from said at least one transfer device.

4. An apparatus according to claim 1, wherein said at least one transfer device comprises a pair of arms which can be opened and closed, said arms being attached to a base which is movable to and from said carrying base.

5. An apparatus according to claim 1, wherein said carrying base rotates by a predetermined angle with the reticle placed thereon.

6. An apparatus according to claim 1, wherein said carrying base has slots for looking at the code number therethrough, said slots being provided at two positions at an angle of 90 degrees.

7. An apparatus according to claim 1, wherein said carrying base comprises a rotatable plate which rotates at 90 degrees.

8. An apparatus according to claim 7, wherein said rotatable plate is substantially square and wherein said carrying base comprises reticle holding means disposed along two neighboring sides of said rotatable plate so as to contact two sides of the reticle, and a swingable clamp means for urging the remaining two sides of the reticle.

9. An apparatus according to claim 1, wherein said label attaching means is disposed so as to reciprocate towards and away from a front of said at least one elevating base.

10. An apparatus according to claim 1, further comprising case holding means behind said at least one elevating base so as to move back and forth to urge a rear side surface of the reticle case to which the label is attached.

* * * * *